(12) United States Patent
Sugimura et al.

(10) Patent No.: US 9,857,432 B2
(45) Date of Patent: Jan. 2, 2018

(54) BATTERY MONITORING SYSTEM, SEMICONDUCTOR CIRCUIT, LINE-BREAKAGE DETECTION PROGRAM, AND LINE-BREAKAGE DETECTION METHOD

(71) Applicants: LAPIS Semiconductor Co., Ltd., Kanagawa (JP); YAZAKI CORPORATION, Tokyo (JP)

(72) Inventors: Naoaki Sugimura, Kanagawa (JP); Takaaki Izawa, Shizuoka (JP)

(73) Assignees: LAPIS SEMICONDUCTOR CO., LTD., Kanagawa (JP); YAZAKI CORPORATION, Tokyo (JP)

( * ) Notice: Subject to any disclaimer, the term of this patent is extended or adjusted under 35 U.S.C. 154(b) by 225 days.

(21) Appl. No.: 14/897,157

(22) PCT Filed: Jun. 11, 2014

(86) PCT No.: PCT/JP2014/065505
§ 371 (c)(1),
(2) Date: Dec. 9, 2015

(87) PCT Pub. No.: WO2014/200033
PCT Pub. Date: Dec. 18, 2014

(65) Prior Publication Data
US 2016/0131718 A1 May 12, 2016

(30) Foreign Application Priority Data
Jun. 14, 2013 (JP) .................................. 2013-126002

(51) Int. Cl.
*G01N 27/416* (2006.01)
*G01R 31/36* (2006.01)
(Continued)

(52) U.S. Cl.
CPC ... *G01R 31/3658* (2013.01); *G01R 19/16542* (2013.01); *G01R 31/02* (2013.01); *G01R 31/026* (2013.01)

(58) Field of Classification Search
CPC .. G01R 31/02; G01R 31/3658; G01R 31/026; G01R 19/16542
(Continued)

(56) References Cited

U.S. PATENT DOCUMENTS

| 2012/0176160 A1* | 7/2012 | Sugimura | G01R 19/16542 327/50 |
| 2012/0179411 A1* | 7/2012 | Sugimura | G01R 31/026 702/117 |
| 2013/0069597 A1* | 3/2013 | Sugimura | H02J 7/0016 320/118 |

FOREIGN PATENT DOCUMENTS

| JP | 2001116776 A | 4/2001 |
| JP | 2002168928 A | 6/2002 |

(Continued)

OTHER PUBLICATIONS

Written Opinion dated Sep. 16, 2014 for International Application No. PCT/JP2014/065505.

*Primary Examiner* — Nathaniel Pelton
(74) *Attorney, Agent, or Firm* — Volentine & Whitt, PLLC

(57) ABSTRACT

The present invention appropriately detects line-breakages in a signal line related to a battery connected to a discharge circuit for discharging. Namely, an initialization operation produces a state in which a capacitor (C1) is charged with the difference between the voltage of a signal line (Vn) and a self-threshold voltage (Vx), and a capacitor (C2) is charged with the difference between the voltage of a signal line (Vn−1) and a self-threshold voltage (Vx), in a comparison circuit (26). In a comparison operation, a voltage adjusting section (ILn+1) produces a state in which line-breakage detection current is drawn out from a signal line
(Continued)

(Ln), a signal line (Lc) is connected to the capacitors (C1, C2) and a voltage (DVn) is input to the capacitors (C1, C2). When an output OUT=L level, it is detected that there is no line-breakage, and when the output OUT=H level, it is detected that there is a line-breakage.

23 Claims, 12 Drawing Sheets

(51) Int. Cl.
*G01R 19/165* (2006.01)
*G01R 31/02* (2006.01)

(58) Field of Classification Search
USPC .......................................................... 324/426
See application file for complete search history.

(56) References Cited

FOREIGN PATENT DOCUMENTS

| | | |
|---|---|---|
| JP | 2002343445 A | 11/2002 |
| JP | 2004170335 A | 6/2004 |
| JP | 2005104989 A | 4/2005 |
| JP | 2005168118 A | 6/2005 |
| JP | 2006029923 A | 2/2006 |
| JP | 2006050784 A | 2/2006 |
| JP | 2007225484 A | 9/2007 |
| JP | 2008175804 A | 7/2008 |
| JP | 2012-145418 | 8/2012 |
| JP | 2012-147587 | 8/2012 |
| JP | 2013-070481 A | 4/2013 |

* cited by examiner

FIG.12
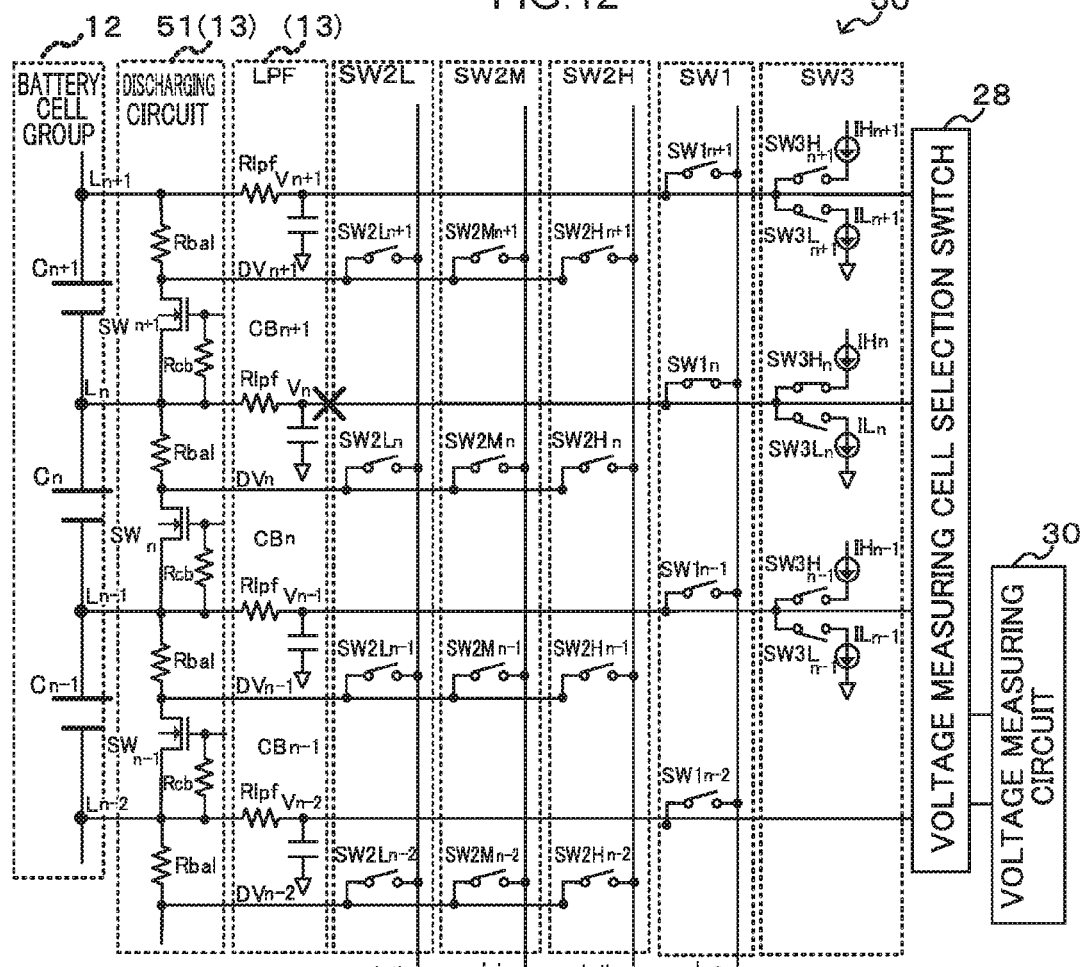
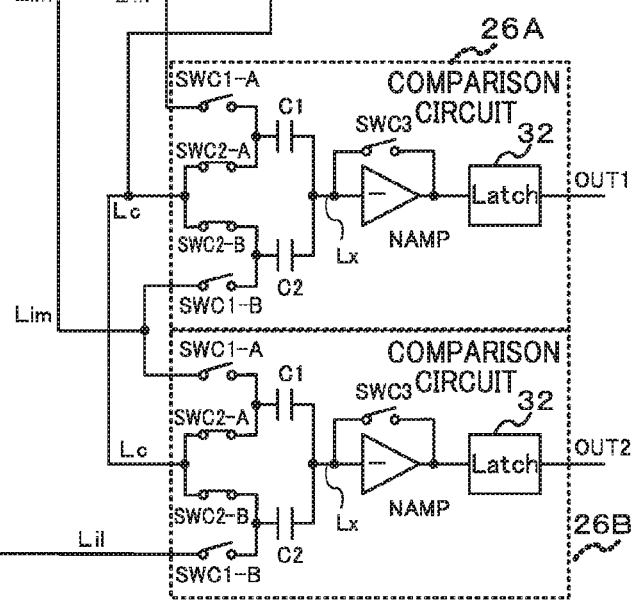

BATTERY MONITORING SYSTEM, SEMICONDUCTOR CIRCUIT, LINE-BREAKAGE DETECTION PROGRAM, AND LINE-BREAKAGE DETECTION METHOD

TECHNICAL FIELD

The present invention relates to a battery monitoring system, a semiconductor circuit, a line-breakage detection program, and a line-breakage detection method. In particular, the present invention relates to a battery monitoring system, a semiconductor circuit, a line-breakage detection program, and a line-breakage detection method for battery voltage monitoring.

BACKGROUND ART

Generally, battery-units in which plural batteries (battery cells) are connected together in series are employed as high capacity, high output battery-units employed for, for example, driving the motors of hybrid automobiles and electric automobiles. Specific examples of such battery-units include lithium ion battery-units. A battery monitoring system is known that monitors and controls the battery voltages of batteries in a battery-unit.

Conventional battery monitoring systems include a battery cell group having plural battery cells, and a semiconductor circuit that measure and controls the voltages of the battery cells included in the battery cell group.

In such battery monitoring systems, for example, processing to equalize cell voltages in a battery cell group (to make the voltage values of the respective battery cells equal) or processing to control charging and discharging (to control charging and discharging of the respective battery cells) is performed based on the voltage information for each battery cell obtained from a semiconductor circuit for performing measurements. In such battery monitoring systems, irregularities sometimes occur in the battery monitoring system when a line-breakage arises in, for example, a signal line connecting a battery cell to the semiconductor circuit for performing measurements.

Therefore, technology is known that detects line-breakages in signal lines (see Japanese Patent Application Laid-Open (JP-A) Nos. 2002-343445, 2001-116776, 2006-29923, 2004-170335, 2005-168118, 2004-104989, 2006-50784, 2007-225484, and 2008-175804). In particular, JP-A No. 2008-175804 describes technology that detects line-breakages in signal lines in a battery monitoring system provided with a discharging circuit for discharging the charge of battery cells.

SUMMARY OF INVENTION

Technical Problem

However, the technology described by JP-A Nos. 2002-343445, 2001-116776, 2006-29923, 2004-170335, 2005-168118, 2004-104989, 2006-50784, 2007-225484, and 2008-175804 have the following issues.

In the technology described by JP-A Nos. 2002-343445, 2001-116776, and 2006-29923, a resistance for detecting line-breakages must be constantly connected between the battery cells. Since a constant current flows from the battery cells, the resistance needs to be a large resistance value in order to suppress current (dark current) when on standby. However, the resistance value is limited, making it difficult to suppress dark current.

Moreover, in the technology described by JP-A Nos. 2004-170335, 2005-168118, 2004-104989, and 2006-50784, an operation is required to make a short circuit between battery cells using a switch in order to detect line-breakages. Making a short circuit causes a discharge operation even when the battery cells are in an overcharged state, and there is therefore a possibility that battery voltages will be made uneven between battery cells.

Moreover, in the technology described by JP-A Nos. 2004-170335, 2007-225484, and 2008-175804, battery voltages are measured in order to determine whether or not there is a line-breakage, and a battery voltage measuring circuit and a computation device for computing the measured voltage difference are needed. Since plural voltages must be measured by the voltage measuring circuit and computing must be performed by the computation device, line-breakage detection takes time, and reducing the time taken is difficult. Moreover, in a semiconductor circuit having only one battery voltage measuring circuit, it is difficult to routinely perform measuring operations for battery voltage cells during the line-breakage detection period.

An object of the present invention is to provide a battery monitoring system, a semiconductor circuit, a line-breakage detection program, and a line-breakage detection method capable of appropriately detecting line-breakages in signal lines related to a battery to which a discharging circuit for discharging is connected.

Solution to Problem

In order to achieve the above object, a first aspect of the present invention is a battery monitoring system including: plural batteries connected together in series; a discharging unit including a resistor element provided straddling between a first signal line connected to a high potential side in the plural respective batteries and a second signal line connected to a low potential side in the plural respective batteries, and a discharge switching element connected in series with the resistor element; a potential adjusting unit that is connected to the first signal line and supplies a lower potential than the potential of the second signal line in cases in which the discharge switching element is provided between the resistor element and the second signal line, and that is connected to the second signal line and supplies a higher potential than the potential of the first signal line in cases in which the discharge switching element is provided between the resistor element and the first signal line; and a comparison unit that compares a first potential between the resistor element and the discharge switching element, against a threshold voltage set from the potential of the first signal line and the potential of the second signal line.

A seventh aspect of the present invention is a battery monitoring system including: plural batteries connected together in series; a discharging unit including a resistor element provided straddling between a first signal line connected to a high potential side in the plural respective batteries and a second signal line connected to a low potential side in the plural respective batteries, and a discharge switching element connected in series with the resistor element; a potential adjusting unit that is connected to the first signal line and supplies a lower potential than the potential of the second signal line in cases in which the discharge switching element is provided between the resistor element and the second signal line, and that is connected to the second signal line and supplies a higher potential than the potential of the first signal line in cases in which the discharge switching element is provided between the resistor element and the first signal line; a comparison unit that compares a first potential between the resistor element and the discharge switching element, against a threshold voltage set from the potential of the first signal line and the potential of the second signal line; and a comparison unit that compares a later stage section potential of a section at a later stage than the discharge unit on the first signal line provided with the discharge unit, against a threshold voltage set from a first potential between the resistor element and the discharge switching element and set from a third potential between the resistor element of the discharge unit and the discharge switching element provided to a battery connected at a low potential side of the battery.

A twelfth aspect of the present invention is a semiconductor circuit including: a potential adjusting unit that is provided to plural respective batteries connected together in series, that is connected to a first signal line and supplies a lower potential than the potential of a second signal line in cases in which a discharge switching element is provided between a resistor element and the second signal line, that is connected to the second signal line and supplies a higher potential than the potential of the first signal line in cases in which the discharge switching element is provided between the resistor element and the first signal line, and that is for the discharge switching element of a discharging unit that includes the resistor element provided straddling between the first signal line connected to a high potential side in the plural respective batteries and the second signal line connected to a low potential side in the plural respective batteries, and that includes the discharge switching element connected to the resistor element in series; and a comparison unit that compares a first potential between the resistor element and the discharge switching element, against a threshold voltage set from the potential of the first signal line and the potential of the second signal line.

A thirteenth aspect of the present invention is a semiconductor circuit including: a potential adjusting unit that is provided to plural respective batteries connected together in series, that is connected to a first signal line and supplies a lower potential than the potential of a second signal line in cases in which a discharge switching element is provided between a resistor element and the second signal line, that is connected to the second signal line and supplies a higher potential than the potential of the first signal line in cases in which the discharge switching element is provided between the resistor element and the first signal line, and that is for the discharge switching element of a discharging unit that includes the resistor element provided straddling between the first signal line connected to a high potential side in the plural respective batteries and the second signal line connected to a low potential side in the plural respective batteries, and that includes the discharge switching element connected to the resistor element in series; and a comparison unit that compares a later stage section potential of a section at a later stage than the discharge unit on the first signal line provided with the discharge unit, against a threshold voltage set from a first potential between the resistor element and the discharge switching element and set from a third potential between the resistor element of the discharge unit and the discharge switching element provided to a battery connected at a low potential side of the battery.

A fourteenth aspect of the present invention is a battery monitoring system including: plural batteries connected together in series; a discharging unit including a resistor element provided straddling between a first signal line connected to a high potential side in the plural respective batteries and a second signal line connected to a low potential side in the plural respective batteries, and a discharge switching element connected in series with the resistor element; a first potential adjusting unit that is connected to the first signal line and that is at a lower potential than the potential of the second signal line; a second potential adjusting unit that is connected to the first signal line and is at a higher potential than the potential of the first signal line; a first comparison unit that compares a later stage section potential of a section at a later stage than the discharge unit on the first signal line provided with the discharge unit, against a threshold voltage set from a first potential between the resistor element and the discharge switching element and set from a second potential between the resistor element of the discharge unit and the discharge switching element provided to a battery connected at a high potential side of the battery; and a second comparison unit that compares the later stage section potential against a threshold voltage set from the first potential and set from a third potential between the resistor element of the discharge unit and the discharge switching element provided to a battery connected at a low potential side of the battery.

A seventeenth aspect of the present invention is a semiconductor circuit including: a first potential adjusting unit that is provided to each of plural respective batteries connected together in series, that is connected to a first signal line of a discharge unit including a resistor element provided straddling between the first signal line connected to the high potential side in the plural respective batteries and a second signal line connected to the low potential side in the plural respective batteries and including a discharge switching element connected in series to the resistor element, and that has a lower potential than the potential of the second signal line; a second potential adjusting unit that is connected to the first signal line, and that has a higher potential than the potential of the first signal line; a first comparison unit that compares a later stage section potential of a section at a later stage than the discharge unit on the first signal line provided with the discharge unit, against a threshold voltage set from a first potential between the resistor element and the discharge switching element and a second potential between the resistor element of the discharge unit and the discharge switching element provided to a battery connected to the high potential side of the battery; and a second comparison unit that compares the later stage section potential, against a threshold voltage set from the first potential and a third potential between the resistor element of the discharge unit and the discharge switching element provided to a battery connected to the low potential side of the battery.

An eighteenth aspect of the present invention is a line-breakage detection program for causing a computer to execute processing that detects line-breakages in the first signal line of the battery monitoring system of any one of the second aspect to the sixth aspect of the present invention. The line-breakage detection program causes the computer to execute processing including: a step of charging the first capacitor with the difference between the potential of the first signal line and a threshold voltage of the single-ended inverting amplifier; a step of charging the second capacitor with the difference between the potential of the second signal line and the threshold voltage of the single-ended inverting amplifier; a step of inputting the first potential to the first capacitor and the second capacitor in a state in which the charges of the first capacitor and the second capacitor are stored; a step of adjusting the potential of the first signal line using the potential adjusting unit; and a step of outputting a comparison result from the comparison unit.

A nineteenth aspect of the present invention is a line-breakage detection program for causing a computer to execute processing that detects line-breakages in the first signal line of the battery monitoring system of any one of the eighth aspect to the eleventh aspect of the present invention. The line-breakage detection program causes the computer to execute processing including: a step of charging the first capacitor with the difference between the potential of the first signal line and a threshold voltage of the single-ended inverting amplifier; a step of charging the second capacitor with the difference between the potential of the third signal line and the threshold voltage of the single-ended inverting amplifier; a step of inputting the later stage section potential to the first capacitor and the second capacitor in a state in which the charges of the first capacitor and the second capacitor are stored; a step of adjusting the potential of the first signal line using the potential adjusting unit; and a step of outputting a comparison result from the comparison unit.

A twentieth aspect of the present invention is a line-breakage detection program for causing a computer to execute processing that detects line-breakages in the first signal line of the battery monitoring system of the fifteenth aspect or the sixteenth aspect of the present invention. The line-breakage detection program causes the computer to execute processing including: a step of charging the first capacitor with the difference between the second potential and a threshold voltage of the first single-ended inverting amplifier; a step of charging the second capacitor with the difference between the first potential and a threshold voltage of the first single-ended inverting amplifier; a step of charging the third capacitor with the difference between the first potential and a threshold voltage of the second single-ended inverting amplifier; a step of charging the fourth capacitor with the difference between the third potential and a threshold voltage of the second single-ended inverting amplifier, a step of inputting the later stage section potential to the first capacitor to the fourth capacitor in a state in which the charges of the first capacitor to the fourth capacitor are stored; a step of adjusting the potential of the first signal line using the first potential adjusting unit or the second potential adjusting unit; and a step of outputting a comparison result from the first comparison unit and the second comparison unit.

A twenty first aspect of the present invention is a line-breakage detection method for detecting line-breakages in the first signal line of the battery monitoring system of any one of the second aspect to the sixth aspect of the present invention. The line-breakage detection method includes: a process of charging the first capacitor with the difference between the potential of the first signal line and a threshold voltage of the single-ended inverting amplifier; a process of charging the second capacitor with the difference between the potential of the second signal line and the threshold voltage of the single-ended inverting amplifier; a process of inputting the first potential to the first capacitor and the second capacitor in a state in which the charges of the first capacitor and the second capacitor are stored; a process of adjusting the potential of the first signal line using the potential adjusting unit; and a process of outputting a comparison result from the comparison unit.

A twenty second aspect of the present invention is a line-breakage detection method for detecting line-breakages in the first signal line of the battery monitoring system of any one of the eighth aspect to the eleventh aspect of the present invention. The line-breakage detection method includes: a process of charging the first capacitor with the difference between the first potential and a threshold voltage of the single-ended inverting amplifier; a process of charging the second capacitor with the difference between the third potential and the threshold voltage of the single-ended inverting amplifier; a process of inputting the later stage potential to the first capacitor and the second capacitor in a state in which the charge of the first capacitor and the second capacitor is stored; a process of adjusting the potential of the first signal line using the potential adjusting unit; and a process of outputting a comparison result from the comparison unit.

A twenty third aspect of the present invention is a line-breakage detection method for detecting line-breakages in the first signal line of the battery monitoring system of the fifteenth aspect or the sixteenth aspect of the present invention. The line-breakage detection method includes: a method of charging the first capacitor with the difference between the second potential and a threshold voltage of the first single-ended inverting amplifier; a method of charging the second capacitor with the difference between the first potential and the threshold voltage of the first single-ended inverting amplifier; a method of charging the third capacitor with the difference between the first potential and a threshold voltage of the second single-ended inverting amplifier; a method of charging the fourth capacitor with the difference between the third potential and a threshold voltage of the second single-ended inverting amplifier; a method of inputting the later stage section potential to the first capacitor to the fourth capacitor in a state in which the charges of the first capacitor to the fourth capacitor are stored; a method of adjusting the potential of the first signal line using the first potential adjusting unit or the second potential adjusting unit; and a method of outputting a comparison result from the first comparison unit and the second comparison unit.

Advantageous Effects

According to the above aspects of the present invention, an advantageous effect is exhibited of enabling line-breakages in a signal line related to a battery connected to a discharging circuit for discharging to be appropriately detected.

BRIEF DESCRIPTION OF DRAWINGS

FIG. 12 is a circuit diagram illustrating a state of a semiconductor circuit in a comparison operation 2 according to the third exemplary embodiment.

DESCRIPTION OF EMBODIMENTS

First Exemplary Embodiment

Detailed explanation follows regarding a battery monitoring system of a first exemplary embodiment, with reference to the drawings.

Figure 1:
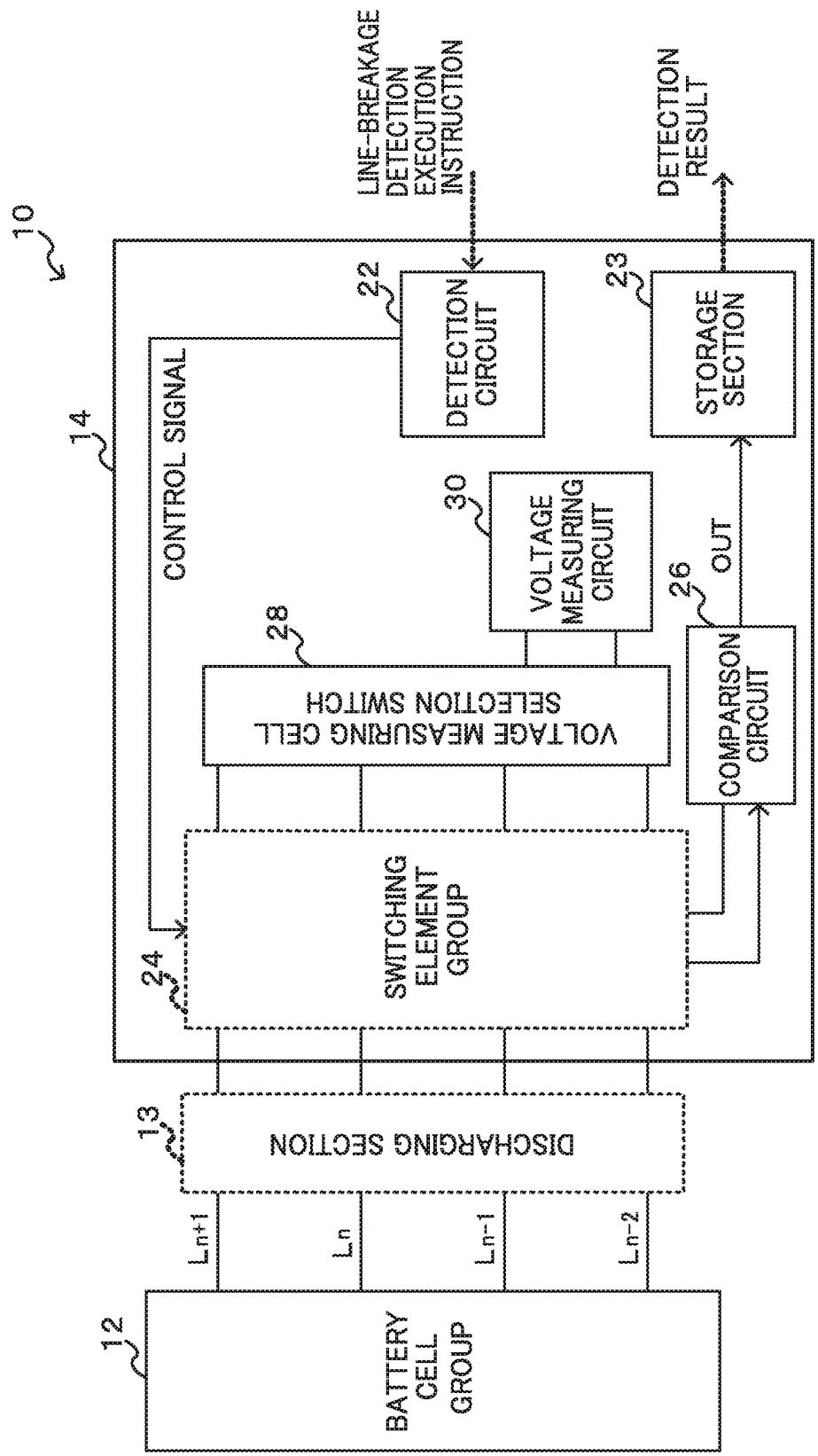
FIG. 1 is a circuit diagram illustrating an example of a schematic configuration of a battery monitoring system according to a first exemplary embodiment.

First, explanation follows regarding a configuration of the battery monitoring system of the present exemplary embodiment. FIG. 1 illustrates an example of a schematic configuration of the battery monitoring system of the present exemplary embodiment. The battery monitoring system of the present exemplary embodiment illustrated in FIG. 1 includes a battery cell group 12 including plural battery cells, a discharging section 13 that discharges the respective battery cells in the battery cell group 12, and a semiconductor circuit 14 that measures the voltages of the respective battery cells in the battery cell group 12.

The discharging section 13 includes a discharging circuit (see the discharging circuit 51 in FIG. 2, described in detail below) and an LPF (low-pass filter, see the LPF in FIG. 2, described in detail below).

The semiconductor circuit 14 includes a detection circuit 22, a storage section 23, a switching element group 24, a comparison circuit 26, a voltage measuring cell selection switch 28, and a voltage measuring circuit 30.

The detection circuit 22 is a logical circuit having functionality for detecting whether or not there is a line-breakage in signal lines Ln+1 to Ln−2 based on an output OUT output from the comparison circuit 26. The detection circuit 22 outputs a control signal that controls the ON/OFF state of the switching element group 24 when an instruction is received from outside such as an instruction to execute detection of whether or not there is a line-breakage in the signal lines Ln+1 to Ln−2.

The storage section 23 has functionality that stores the output OUT (a logical value indicating H level or L level) output from the comparison circuit 26. Specific examples of the storage section 23 include a register. The detection circuit 22 of the present exemplary embodiment detects whether or not there is a line-breakage in the signal lines Ln+1 to Ln−2 based on the logical value stored (saved) in the storage section 23.

Figure 2:
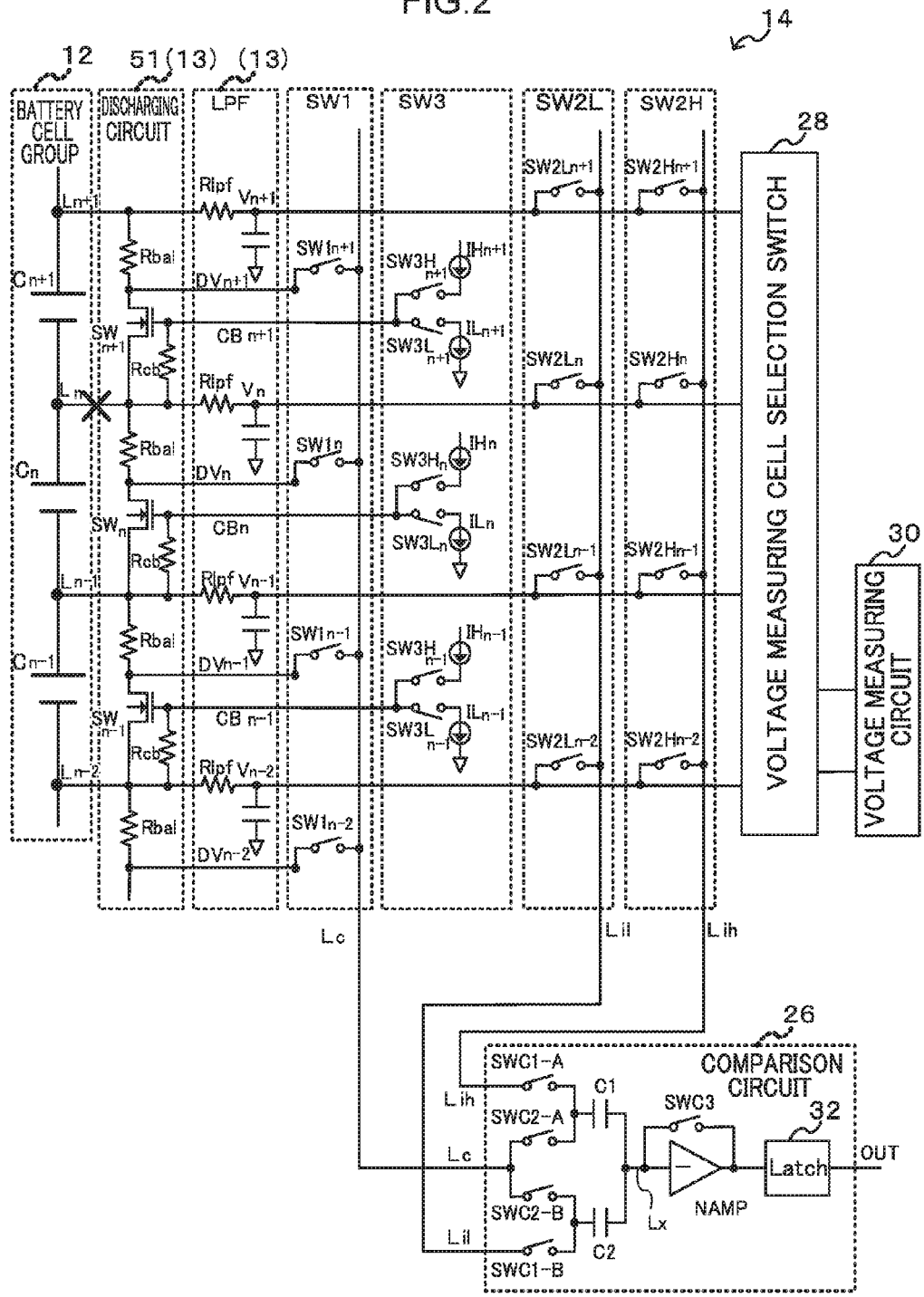
FIG. 2 is a circuit diagram illustrating an example of a schematic configuration of a semiconductor circuit according to the first exemplary embodiment.

FIG. 2 illustrates an example of a schematic configuration of the discharging section 13 and the semiconductor circuit 14 of the present exemplary embodiment. The semiconductor circuit 14 of the present exemplary embodiment has functionality for detecting whether or not there is a line-breakage in the signal lines L between the battery cell group 12 and the discharging section 13 (more specifically, the discharging circuit 51). Note that in the present exemplary embodiment, as a specific example, the battery cell group 12 includes three cells C (Cn−1 to Cn+1), and is connected to the semiconductor circuit 14 by the signal lines Ln−2 to Ln+1 through the discharging section 13. Note that, hereafter, cells C is used when collectively referring to the three cells C (Cn−1 to Cn+1). Moreover, signal lines L is used when collectively referring to the signal lines Ln−2 to Ln+1. Moreover, the detection circuit 22 and the storage section 23 are omitted from illustration in FIG. 2.

The discharging section 13 of the present exemplary embodiment illustrated in FIG. 2 includes the discharging circuit 51 and the LPF.

The discharging circuit 51 has functionality to cause a short circuit between the high potential side and low potential side of a battery cell C in the battery cell group 12, and thereby discharge the battery cell C. The discharging circuit 51 includes resistor elements Rba1, and switching element switches that are connected to the resistor elements Rba1 in series (switch n−1 to switch n+1; collectively referred to as switching element switches). In the present exemplary embodiment, an NMOS transistor is employed as a specific example of the switching element switches. In the switching element switches, the drain is connected to the signal line L at the high potential side of the battery cells C through resistor elements Rba1 that limit the discharge amount for the battery cell C, and the source is connected to the signal line L at the low potential side of the battery cell C. Moreover, in the switching element switches, the gate is connected to the switching element switch 3, and is also connected to the signal line L at the low potential side, through a resistor element Rcb that is a pull-down resistor. When the gate of the switching element switch is set to ON, a short circuit is made between battery cells C, thereby causing the battery cells C to discharge. In the present exemplary embodiment, setting the gate of the switching element switches ON and OFF is controlled by a voltage adjuster IH of the switching element switch 3 (described in detail below). The voltage adjuster IH is a constant current source, and the gate of the switching element switches are set to ON when a voltage is supplied to a signal line CB from the voltage adjuster IH.

Note that the configuration of the discharging circuit 51 is not limited to the above. For example, configuration may be made such that a PMOS transistor serves as the switching element switch, one terminal of the switching element switch is connected to the signal line L at the high potential side of the corresponding battery cell, and one terminal of the resistor element Rba1 is connected to the signal line L at the low potential side of the battery cell C. Note that in such cases, switching of the gate of the switching element switch ON and OFF is controlled by a voltage adjuster IL of the switching element switch 3 (described in detail below). Moreover, in a comparison operation, described in detail below, a voltage higher than that of the signal line at the high potential side is supplied to the signal line at the low potential side by the voltage adjuster IH.

The LPF has functionality for suppressing abrupt voltage fluctuations from arising in each cell C in the battery cell group 12 by performing cut-off of high frequency components. The LPF is connected to the signal lines L at the high potential side of the each of the cells C.

The semiconductor circuit 14 illustrated in FIG. 2 includes a switching element group 24, a comparison circuit 26, a voltage measuring cell selection switch 28, and a voltage measuring circuit 30. The switching element group 24 includes a switching element switch 1, switching element switches 2L, 2H, and the switching element switch 3 that includes the voltage adjusters IH, IL.

The semiconductor circuit 14 includes the signal lines L, signal lines V, the signal lines CB, and signal lines DV. The signal lines L connect the battery cell group 12 to the discharging section 13. The signal lines V connect the LPF to the voltage measuring cell selection switch 28. The signal lines CB connect the gates of the switching element switches of the discharging circuit 51 to the switching element switch 3. The signal lines DV connect the signal lines L at the high potential side of the cells C to the switching element switch 1 through the resistor elements Rba1.

The voltage measuring cell selection switch 28 includes plural internal switching element switches (omitted from illustration in the drawings). The selection switch 28 has functionality for switching the internal switching elements and thereby selecting the voltage at the high potential side (signal line L) and the voltage at the low potential side (signal line L) of the cell C subject to battery voltage measurement and observation. The voltage measuring circuit 30 has functionality for measuring the battery voltages of the cells C based on the voltage selected by the voltage measuring cell selection switch 28.

The switching element switch 1 has functionality for connecting the signal lines DV to a signal line Lc. The switching element switch 1 connects the signal line L that is subject to line-breakage detection to the signal line Lc based on the control signal from the detection circuit 22. The switching element switch 1 includes a respective switching element switch 1 (switch 1n−2 to switch 1n+1) for each respective signal line L. Note that hereafter, switching element switches 1 is used to collectively refer to the switching element switches 1 (switch 1n−2 to switch 1n+1).

A respective switching element switch 2L (switch 2Ln−2 to switch 2Ln+1) and a respective switching element switch 2H (switch 2Hn−2 to switch 2Hn+1) is provided to each respective signal line V. Note that hereafter, switching element switches 2L is used to collectively refer to the switching element switches 2L (switch 2Ln−2 to switch 2Ln+1). Moreover, switching element switches 2H is used to collectively refer to the switching element switches 2H (switch 2Hn−2 to switch 2Hn+1). The switching element switches 2L have functionality for connecting the signal lines V to the signal line Lil based on the control signal from the detection circuit 22. Moreover, the switching element switches 2H have functionality for connecting the signal lines V to the signal line Lih based on the control signal from the detection circuit 22.

The switching element switch 3 includes switching element switches 3H (switch 3Hn−1 to switch 3Hn+1), switching element switches 3L (switch 3Ln−1 to switch 3Ln+1), and the voltage adjusters IH, IL that are constant current sources. Note that hereafter, switching element switches 3H is used to collectively refer to the switching element switches 3H (switch 3Hn−1 to switch 3Hn+1). Moreover, switching element switches 3L is used to collectively refer to the switching element switches 3L (switch 3Ln−1 to switch 3Ln+1). Similarly, the individual reference numerals are not mentioned when collectively referring to the voltage adjusters IH, IL. Switching element switches 3H, 3L and respective voltage adjusters IH, IL are provided to each signal line CB.

The switching element switch 3L has functionality for connecting the signal line CB to the voltage adjuster IL based on the control signal from the detection circuit 22. The switching element switch 3L has functionality to supply a given signal line L with a voltage lower than a low voltage corresponding to the signal line L that is supplied with a low voltage lower than the given signal line L. More specifically, for example, the voltage adjuster ILn connected to the signal line Ln by the switching element switch 3Ln supplies the signal line Ln with a voltage lower than the power source voltage supplied to the signal line Ln−1.

The switching element switches 3H have functionality for connecting the signal lines CB to the voltage adjusters IH. The switching element switches 3H are set to ON when the cells C are being charged, and a voltage is applied to the gates of the switching element switches from the voltage adjuster IH.

The comparison circuit (comparator) 26 of the present exemplary embodiment employs a chopper comparator. The comparison circuit 26 includes switching elements switch C1-A, switch C2-A, switch C1-B, switch C2-B, capacitors C1, C2, a switching element switch C3, a single-ended inverting amplifier NAMP with a self-threshold voltage of Vx, and a latch circuit (latch) 32.

The switching element switch C1-A has functionality for connecting the signal line Lih to the capacitor C1. The switching element switch C2-A has functionality for connecting the signal line Lc to the capacitor C1. Moreover, the switching element switch C1-B has functionality for connecting the signal line Lil to the capacitor C2. The switching element switch C2-B has functionality for connecting the signal line Lc to the capacitor C2.

The latch circuit 32 has functionality for ascertaining a logical value (H level or L level) from the output voltage of the single-ended inverting amplifier NAMP, and outputting the ascertained logical value.

Next, explanation follows regarding a line-breakage detection operation of the present exemplary embodiment. The line-breakage detection operation of the present exemplary embodiment is controlled by, for example, execution of a line-breakage detection program in the detection circuit 22. Generally, in such a battery monitoring system 10 or the like, line-breakage easily occurs in locations such as signal lines that connect a circuit, such as a semiconductor circuit, to another circuit, or at connection terminals (pads). Hence, in the present exemplary embodiment, detailed explanation is given regarding the line-breakage detection operation in a case in which, as a specific example, a line-breakage (see the cross in FIG. 2, FIG. 4, and FIG. 5) is detected in the signal line Ln between the battery cell group 12 and the discharging section 13. The line-breakage detection operation of the present exemplary embodiment is divided into an initialization operation, and a comparison operation (which includes a diagnosis operation in the present exemplary embodiment).

Figure 3:
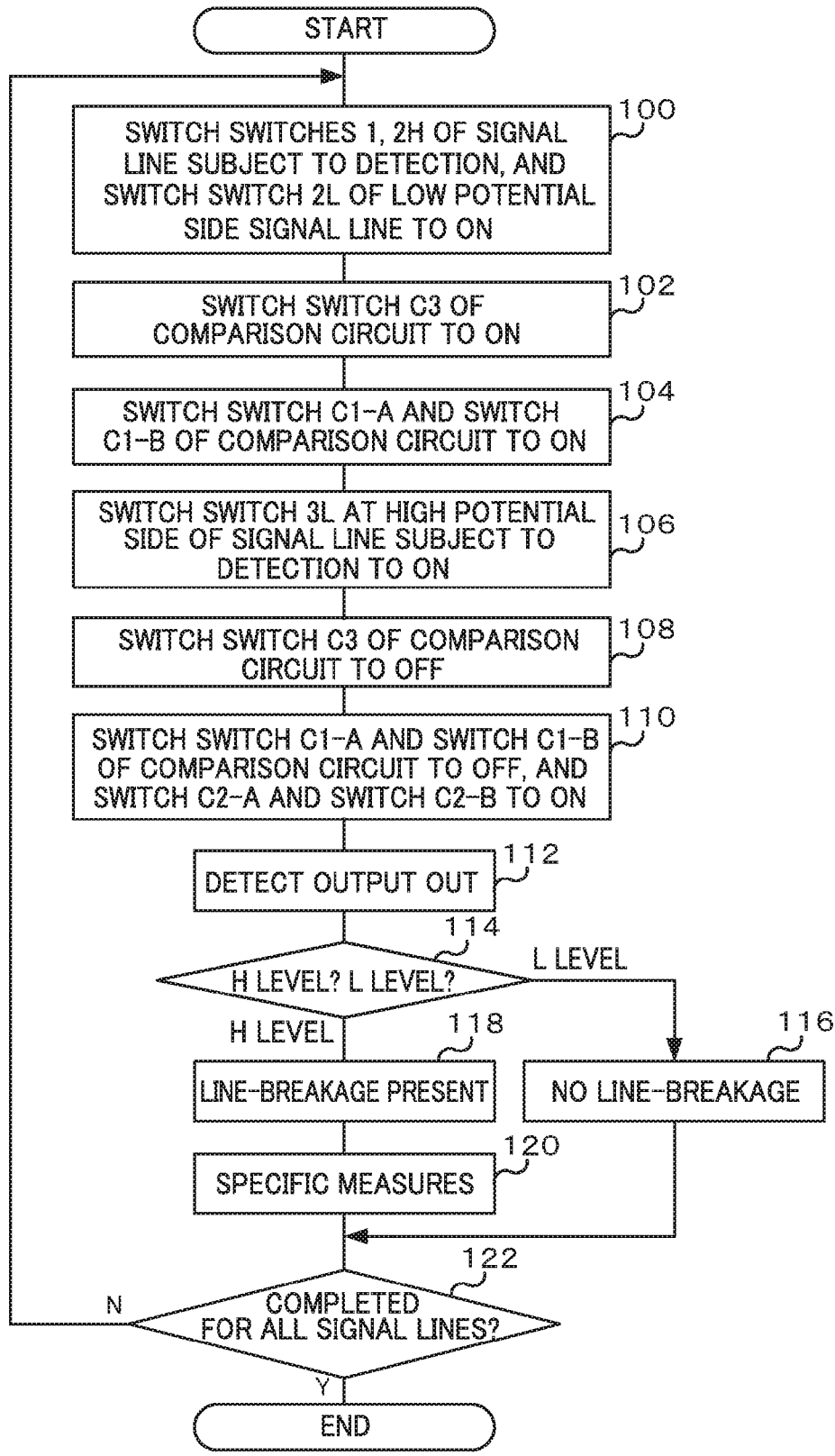
FIG. 3 is a flowchart illustrating an example of a flow of line-breakage detection operation according to the first exemplary embodiment.
Figure 4:
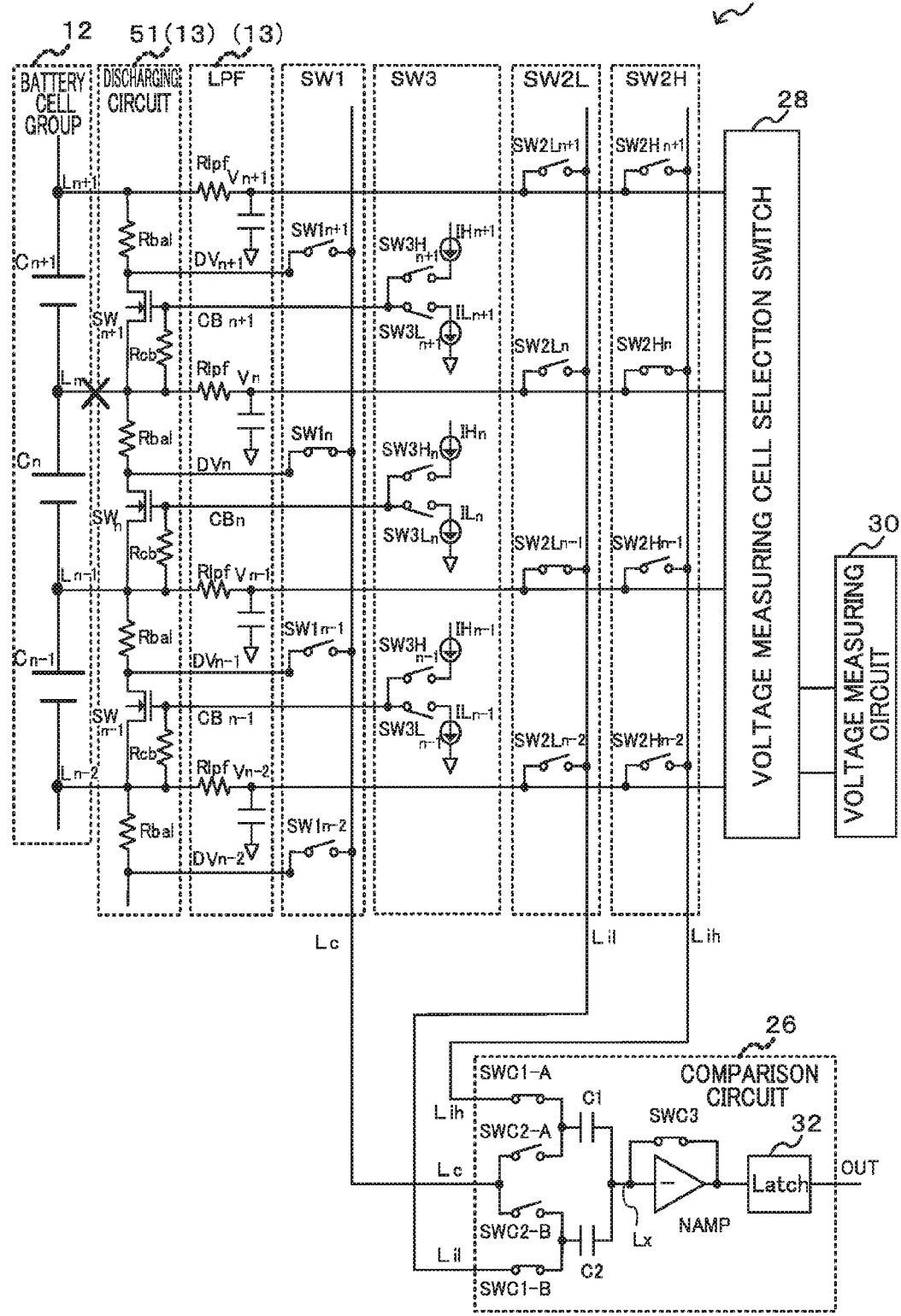
FIG. 4 is a circuit diagram illustrating a state of a semiconductor circuit in an initialization operation according to the first exemplary embodiment.
Figure 5:
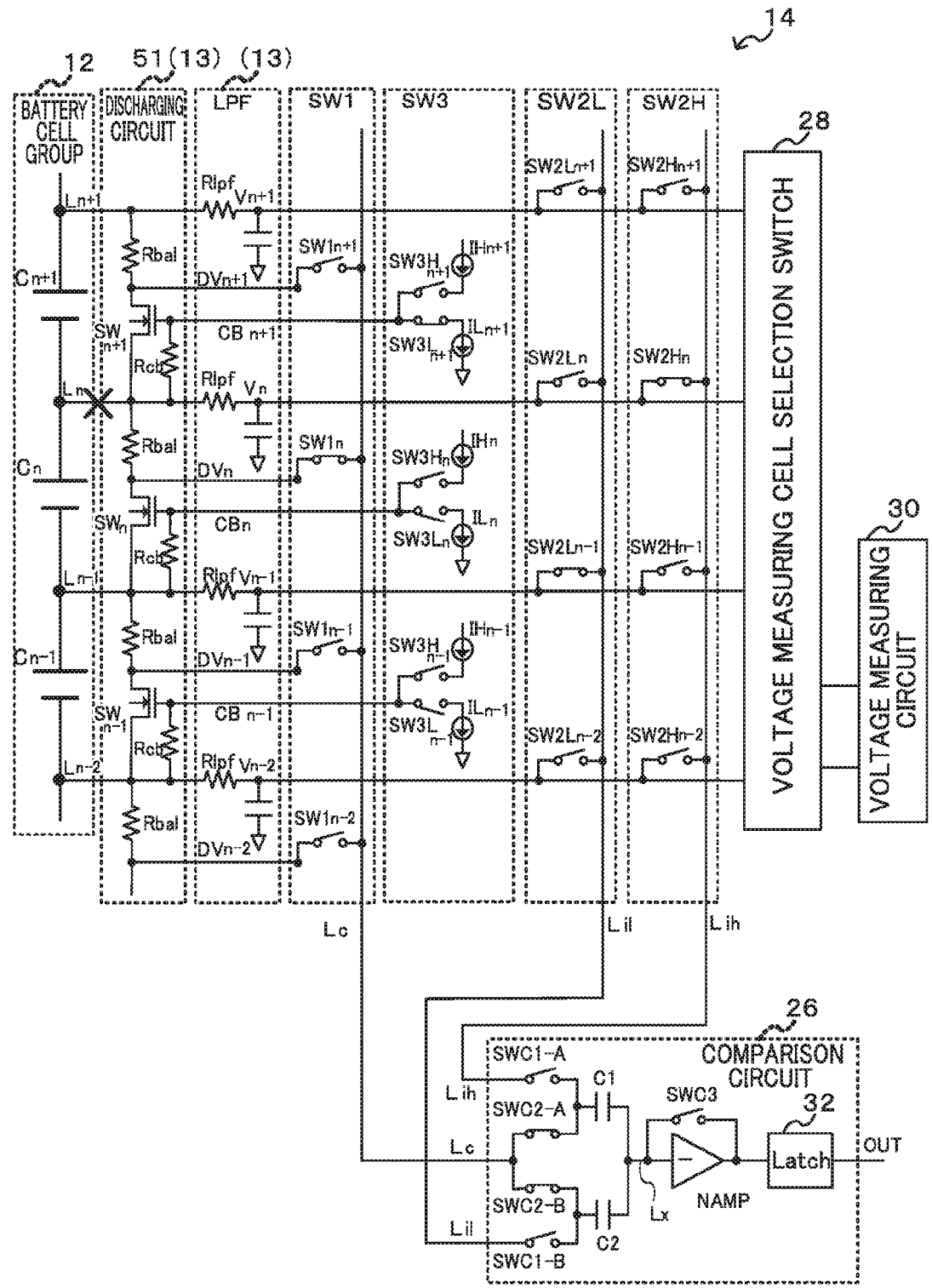
FIG. 5 is a circuit diagram illustrating a state of a semiconductor circuit in a comparison operation according to the first exemplary embodiment.

FIG. 3 illustrates a flowchart of an example of an overall flow of a line-breakage detection operation of the present exemplary embodiment. Moreover, FIG. 4 illustrates a circuit diagram illustrating a state of the semiconductor circuit 14 during the initialization operation. FIG. 5 illustrates a circuit diagram illustrating a state of the semiconductor circuit 14 during the comparison operation.

At step 100, the detection circuit 22 sets the switching elements switch 1, switch 2H of the signal line L in which line-breakage is to be detected, and the switching element switch 2L of the signal line L at the low potential side of the signal line L in which line-breakage is to be detected, to ON. As a specific example, the detection circuit 22 sets the switching elements switch 1n, switch 2Hn to ON, and sets the switching element switch 2Ln−1 to ON (see FIG. 4). Setting the switching element switch 1n to ON connects the signal line Ln to the signal line Lc through the resistor element Rba1. Moreover, setting the switching element switch 2Hn to ON connects a signal line Vn of the LPF to the signal line Lih. Moreover, setting the switching element switch 2Ln−1 to ON connects the signal line Vn−1 to the signal line Lil.

At the next step 102, the detection circuit 22 sets the switching element switch C3 of the comparison circuit 26 to ON. The voltage of the input signal line Lx of the single-ended inverting amplifier NAMP of the comparison circuit 26 thereby becomes the self-threshold voltage Vx of the single-ended inverting amplifier NAMP.

At the next step 104, the detection circuit 22 sets the switching element switch C1-A of the comparison circuit 26 to ON (see FIG. 4). This produces a state in which the capacitor C1 has been charged by the difference between the voltage of the signal line Vn and the self-threshold voltage Vx (the voltage of the signal line Vn−the self-threshold voltage Vx). The switching element switch C1-B of the comparison circuit 26 is also set to ON (see FIG. 4). This produces a state in which the capacitor C2 has been charged by the difference between the voltage of the signal line Vn−1 and the self-threshold voltage Vx (the voltage of the signal line Vn−1−the self-threshold voltage Vx).

Note that the initialization operation of the present exemplary embodiment corresponds to step 100 to step 104.

When the initialization operation has completed, at the next step 106, the detection circuit 22 sets the switching element switch 3L at the high potential side of the signal line L subject to detection to ON. As a specific example, the detection circuit 22 sets the switching element switch 3Ln+1 to ON (see FIG. 5). The voltage adjuster ILn+1 is thereby connected to the signal line CBn+1. Note that in this event, the gate of the switching element switch n+1 is set to OFF since the switching element switch 3Hn+1 is OFF. The potential of the signal line Ln is thereby drawn to the voltage adjuster ILn+1 through the pull-down resistor element Rcb of the gate of the switching element switch n+1, and the line-breakage detection current is extracted.

At the next step 108, the detection circuit 22 sets the switching element switch C3 of the comparison circuit 26 to OFF (see FIG. 5). The voltage of the input Lx of the single-ended inverting amplifier NAMP thereby assumes a high impedance state, and a state is produced in which the charge charged to the capacitors C1, C2 by the initialization operation described above is stored.

At the next step 110, the detection circuit 22 sets the switching element switch C1-A of the comparison circuit 26 to OFF and sets the switching element switch C2-A to ON. Moreover, the detection circuit 22 sets the switching element switch C1-B to OFF, and sets the switching element switch C2-B to ON. When the charge on the capacitor C1 is denoted charge Q1, the capacitance of the capacitor C1 is denoted capacitance C1, the charge on the capacitor C2 is denoted charge Q2, and the capacitance of the capacitor C2 is denoted capacitance C2, the charges Q1, Q2 can be expressed by Equations (1) and (2) below.

$$Q1=C1(Vn-Vx) \quad (1)$$

$$Q2=C2(V(n-1)-Vx) \quad (2)$$

Moreover, when the voltage of the input signal line Lx is denoted as a voltage Vx', Equation (3) below is given from the combined capacitance of the capacitors C1, C2.

$$(C1+C2)(Lc-Vx')=C1(Vn-Vx)+C2(V(n-1)-Vx) \quad (3)$$

Equation (4) below is then given accordingly.

$$Vx'-Vx=(Lc-V(n-1))-C1/(C1+C2)\times(Vn-V(n-1)) \quad (4)$$

Since the switching element switch n is in the OFF state as described above, the voltage of the signal line DVn at the drain side of the switching element switch n is equivalent to the voltage of the signal line Ln, and becomes the voltage of the signal line Lc.

When the output voltage of the single-ended inverting amplifier NAMP is denoted Vnampout, and the gain of the single-ended inverting amplifier NAMP is denoted Gnamp, Equation (5) below is given.

$$Vnampout=-Gnamp\times(Vx'-Vx) \quad (5)$$

When the gain Gnamp is sufficiently high, the logical output of the single-ended inverting amplifier NAMP is determined by the sign of the voltage Vx'−the self-threshold voltage Vx.

When there is no line-breakage in the signal line Ln, the line-breakage detection current (voltage) extracted from the signal line Ln by the voltage adjuster ILn+1 is supplied from the cell C, and the voltage of the signal line Lc therefore remains the voltage of the signal line Ln and does not change. Equation (6) is obtained accordingly.

$$Vx'-Vx=(Lc-V(n-1))-C1/(C1+C2)\times(Vn-V(n-1))>0 \quad (6)$$

The output OUT of the comparison circuit 26 thereby becomes L level.

However, when there is a line-breakage in the signal line Ln, a state is given in which the signal line Lc is connected to the signal line Vn through the LPF. When the resistance of the LPF is denoted Rlpf, and when the line-breakage detection current is denoted ILn+1, the voltage of the signal line Lc to which the line-breakage detection current is drawn out is given by Equation (7).

$$Lc=Vn-IL(n+1)\times Rlpf \quad (7)$$

If the line-breakage detection current is set such that the relationship in Equation (8) below is satisfied, then the output OUT of the comparison circuit 26 becomes H level as in Equation (9) below.

$$ILn+1\times Rlpf>(Lc-V(n-1))-C1/(C1+C2)\times(Vn-V(n-1))(=\text{battery voltage of cell } Cn\times C2/(C1+C2)) \quad (8)$$

$$Vx'-Vx=(Lc-V(n-1))-C1/(C1+C2)\times(Vn-V(n-1))<0 \quad (9)$$

At the next step 112, the detection circuit 22 detects the output OUT output by the comparison circuit 26. At the next step 114, the detection circuit 22 determines whether the output OUT is H level or L level. When the output OUT is L level, processing proceeds to step 116, and, as described above, processing proceeds to step 122 after it has been determined that there is no line-breakage. However, when the output OUT is H level, processing proceeds to step 118, and, as described above, it is detected that there is a line-breakage, and processing proceeds to step 120 when there is a line-breakage, and then, processing proceeds to step 122 after, for example, operation of the battery monitoring system 10 has been suspended and specific measures have been taken.

At step 122, the detection circuit 22 determines whether or not the operations of step 100 to step 120 have been performed for all of the signal lines L, and if these operations have not been performed for all of the signal lines L, processing returns to step 100 and the present operations are repeated. However, when these operations have been performed for all of the signal lines L, the present processing ends since the line-breakage detection operation has completed for all of the signal lines L.

In the present exemplary embodiment, the results for the output OUT are as listed in Table 1.

TABLE 1

| | Logical value of comparison operation output OUT |
|---|---|
| No line-breakage (OK) | L level |
| Line-breakage present (bad) | H level |

As explained above, in the semiconductor circuit 14 of the present exemplary embodiment, when detecting line-breakages in the signal line Ln, the initialization operation produces a state in which the capacitor C1 of the comparison circuit 26 is charged by the difference between the voltage of the signal line Vn and the self-threshold voltage Vx (the signal line Vn−the self-threshold voltage Vx). Moreover, in the semiconductor circuit 14, a state is produced in which the capacitor C2 is charged by the difference between the voltage of the signal line Vn−1 and the self-threshold voltage Vx (the signal line Vn−1−the self-threshold voltage Vx). In the comparison operation, the line-breakage detection current is drawn out from the signal line Ln by the voltage adjuster ILn+1, and the voltage DVn is input to the capacitors C1, C2 by connecting the signal line Lc to the capacitors C1, C2, and it is detected that there is no line-breakage if the output OUT=L level, or it is detected that there is a line-breakage if the output OUT=H level.

Thus, in the semiconductor circuit 14 of the present exemplary embodiment, the switching element switches 1 are provided so as to connect the node between the resistor element Rba1 of the discharging circuit 51 and the switching element switch n, to the signal line Lc. The switching element switches 2L are provided so as to connect the signal line Vn−1 at the later stage side of the LPF to the signal line Lil. The switching element switches 2H are provided so as to connect the signal line Vn at the later stage side of the LPF to the signal line Lih. Moreover, the switching element switch 3Ln+1 is provided so as to connect the signal line CBn+1 connected to the signal line Ln through the resistor element Rcb to the voltage adjuster ILn+1.

Accordingly, in the semiconductor circuit 14, which is provided with the discharging section 13, and, in particular, the discharging circuit 51, detection of line-breakages in the signal lines L between the battery cell group 12 and the discharging section 13 (the discharging circuit 51) can be performed appropriately.

Moreover, the voltage adjusters IL are not always connected to the signal lines L (through the signal lines CB and the resistor elements Rcb), and an advantageous effect is thereby obtained of current not always flowing from the voltage adjusters IL, and current (dark current) not being produced when on standby since the signal lines L are only connected during line-breakage detection.

Moreover, since it is sufficient to set the line-breakage detection current such that Equation (8) is satisfied, the discharging current can be made much smaller when a switching element switch short circuits between cells C. Accordingly, variation does not readily arise in the battery voltages of the cells C.

Moreover, since line-breakages can be appropriately detected by the comparison circuit 26, line-breakages can be detected without employing a calculation device or the like for calculating the difference between the voltages measured for the voltage measuring cell selection switch 28 and the voltage measuring circuit 30. An advantageous effect is accordingly obtained of enabling line-breakage detection to be performed even during an operation that measures the battery voltages of the cells C using the voltage measuring cell selection switch 28 and the voltage measuring circuit 30. Namely, the voltage measuring circuit 30 is a single battery monitoring system 10, and the ordinary battery voltages of the cells C can be measured even during line-breakage detection.

Moreover, in the present exemplary embodiment, the voltage adjusters IL are provided in addition to the voltage adjusters IH that supply voltage to the gates of the switching element switches of the discharging circuit 51 so as to control their ON/OFF states, and this makes it unnecessary to provide separate components, and obtains an advantageous effect of, for example, preventing a large increase in the scale of the battery monitoring system 10.

Second Exemplary Embodiment

Explanation follows regarding a semiconductor circuit of a battery monitoring system of a second exemplary embodiment of the present invention, with reference to the drawings. In the first exemplary embodiment, detailed explanation has been given of a case in which line-breakage was detected in the signal lines L between the battery cell group 12 and the LPF (a first stage of the LPF) in the semiconductor circuit 14; however, in the present exemplary embodiment, detailed explanation is given regarding a semiconductor circuit 40 and the operation thereof when detecting line-breakages in a signal line V between a discharging section 13 (LPF) (a later stage of the LPF) and a semiconductor circuit 40 (see the crosses in FIG. 6 to FIG. 8).

Figure 6:
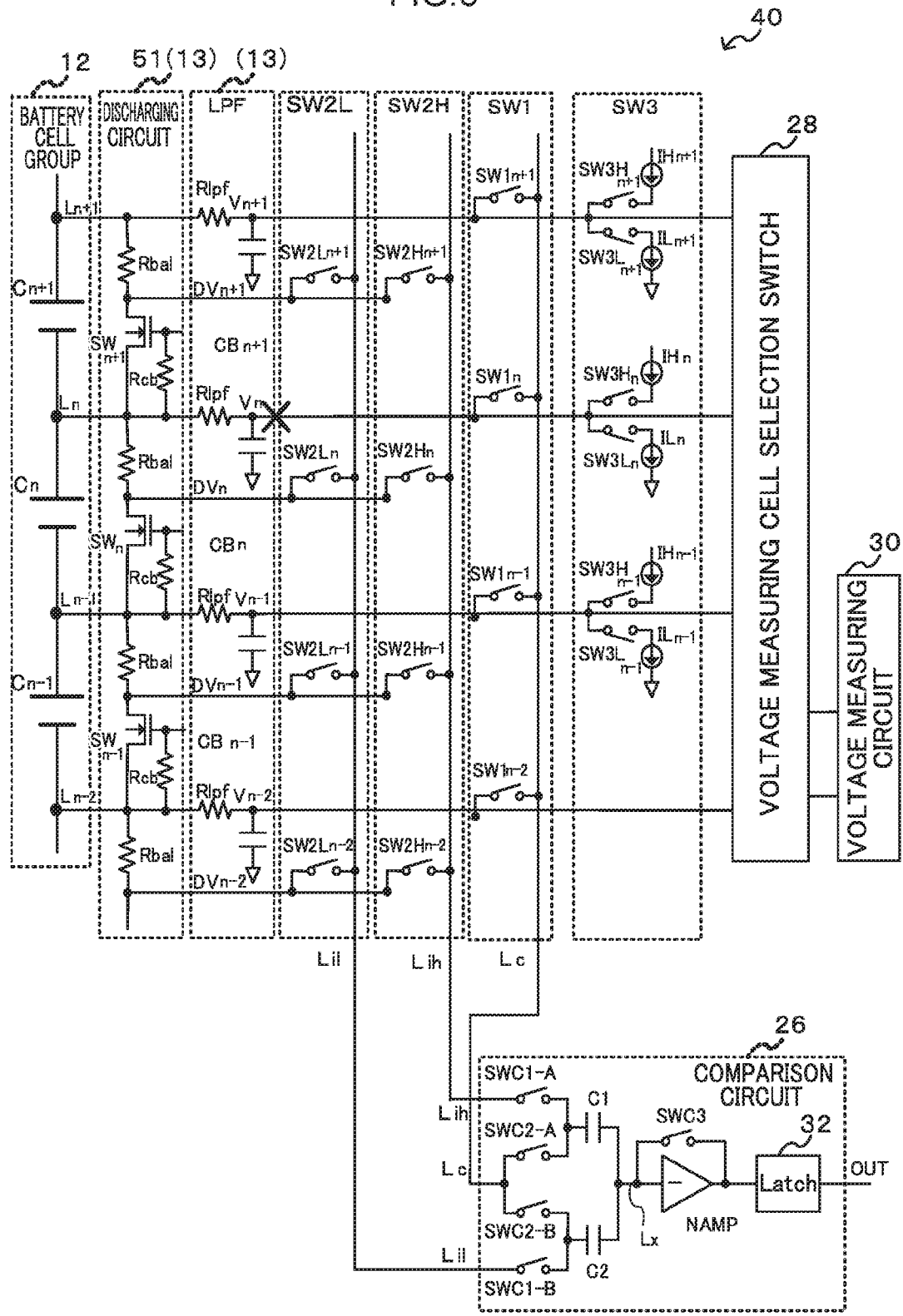
FIG. 6 is a circuit diagram illustrating an example of a schematic configuration of a semiconductor circuit according to a second exemplary embodiment.

FIG. 6 illustrates an example of a schematic configuration of the semiconductor circuit 40 of the present exemplary embodiment. Note that in the present exemplary embodiment, configuration and operation that is substantially similar to that of the first exemplary embodiment is stated, and detailed explanation thereof is omitted.

In the semiconductor circuit 40 of the present exemplary embodiment, in order to detect line-breakages in signal lines V at the later stage of the LPF, a switching element switch 1 is provided for each respective signal line Vn so as to connect the signal lines V to a signal line Lc, and a switching element switch 3 is provided for each respective signal line Vn so as to draw out the line-breakage detection current from the signal lines V. Moreover, a switching element switch 2L is provided for each respective signal line DV so as to connect the signal lines DV to a signal line Lil, and a switching element switch 2H is provided for each respective signal line DV so as to connect the signal lines DV to a signal line Lih.

In the present exemplary embodiment, configuration is made such that the gates of the switching element switches of the discharging circuit 51 of the discharging section 13 are controlled separately. When the line-breakage detection operation is performed, at least each of the gates of the switching element switches that connect to the signal lines employed in the line-breakage detection operation are set to OFF.

Figure 7:
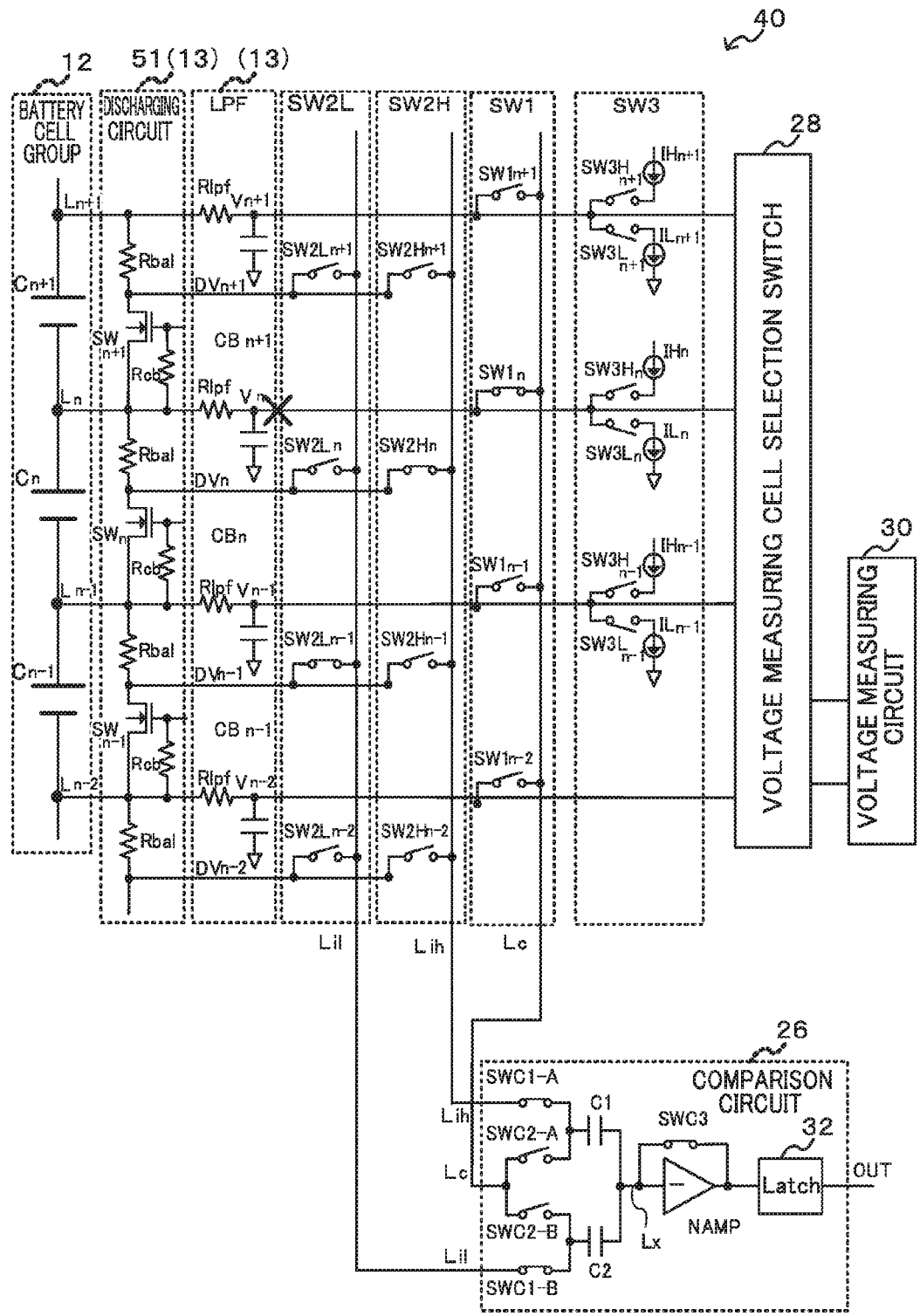
FIG. 7 is a circuit diagram illustrating a state of a semiconductor circuit in an initialization operation according to the second exemplary embodiment.
Figure 8:
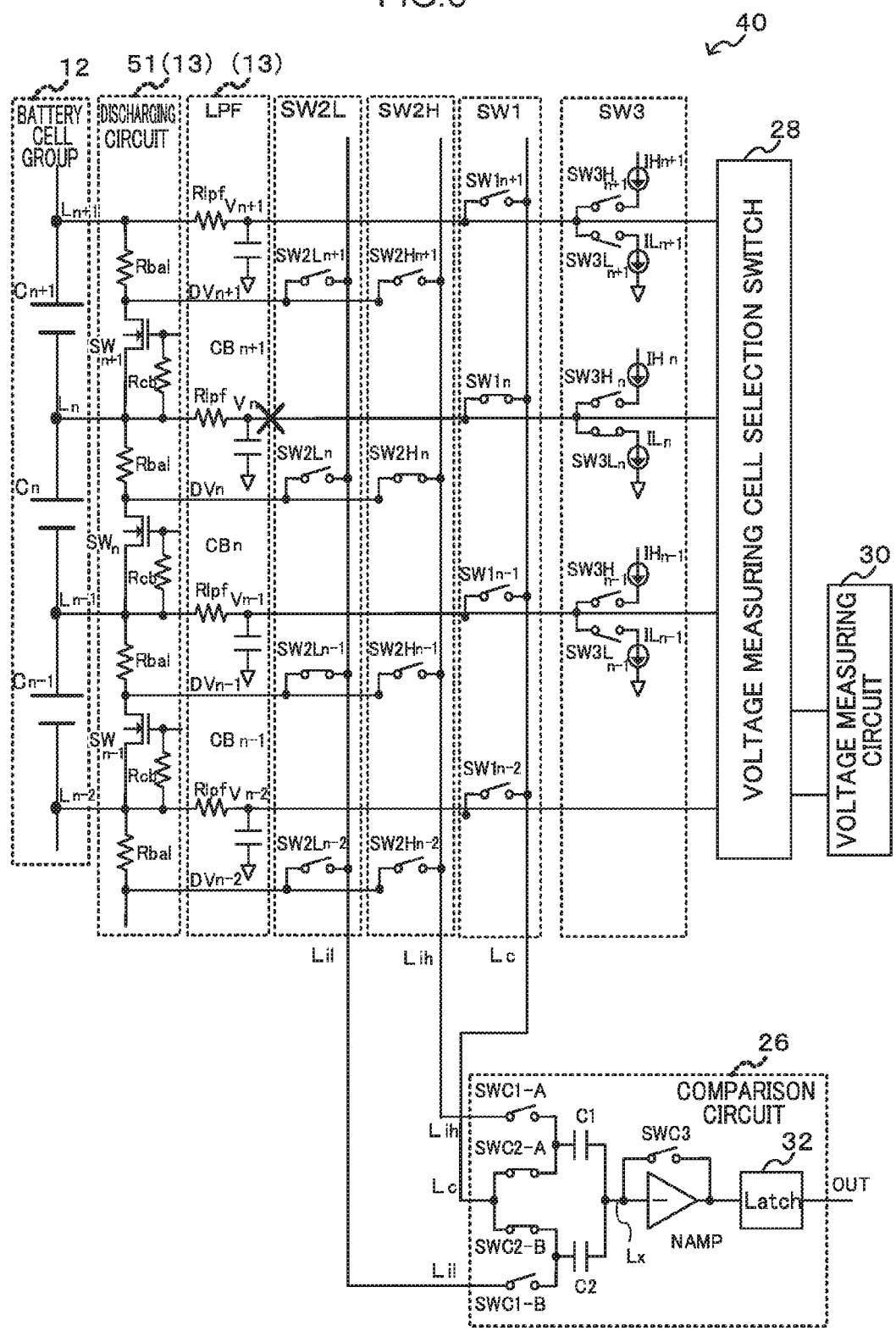
FIG. 8 is a circuit diagram illustrating a state of a semiconductor circuit in a comparison operation according to the second exemplary embodiment.

Next, explanation follows regarding the overall line-breakage detection operation in the present exemplary embodiment. The overall flow of the line-breakage detection operation is substantially similar to in the first exemplary embodiment, and so explanation refers to the flowchart illustrating the first exemplary embodiment (FIG. 3) here. FIG. 7 illustrates a circuit diagram illustrating the state of the semiconductor circuit 40 in the initialization operation. FIG. 8 illustrates a circuit diagram illustrating the state of the semiconductor circuit 40 in the comparison operation.

At step 100, the detection circuit 22 sets the switching elements switch 1, switch 2H of the signal line L in which line-breakage is to be detected, and the switching element switch 2L of the signal line L at the low potential side of the signal line L in which line-breakage is to be detected, to ON. As a specific example, the detection circuit 22 sets the switching elements switch 1n, switch 2Hn to ON, and sets the switching element switch 2Ln−1 to ON (see FIG. 7). Setting the switching element switch 1n to ON connects the signal line Vn to the signal line Lc. Moreover, setting the switching element switch 2Hn to ON connects a signal line DVn to the signal line Lih. Moreover, setting the switching element switch 2Ln−1 to ON connects the signal line DVn−1 to the signal line Lil.

At the next step 102, the detection circuit 22 sets a switching element switch C3 of a comparison circuit 26 to ON. The voltage of an input signal line Lx of a single-ended inverting amplifier NAMP of the comparison circuit 26 thereby becomes the self-threshold voltage Vx of the single-ended inverting amplifier NAMP.

At the next step 104, the detection circuit 22 sets the switching element switch C1-A of the comparison circuit 26 to ON (see FIG. 7). This produces a state in which a capacitor C1 has been charged by the difference between the voltage of the signal line DVn and the self-threshold voltage Vx (the voltage of the signal line DVn−the self-threshold voltage Vx). Moreover, a switching element switch C1-B of the comparison circuit 26 is set to ON by the detection circuit 22 (see FIG. 7). This produces a state in which a capacitor C2 has been charged by the difference between the voltage of the signal line DVn−1 and the self-threshold voltage Vx (the voltage of the signal line DVn−1−the self-threshold voltage Vx).

Note that the initialization operation of the present exemplary embodiment corresponds to step 100 to step 104.

When the initialization operation has completed, at the next step 106, the detection circuit 22 sets the switching element switch 3L of the signal line L subject to detection to ON. As a specific example, the detection circuit 22 sets the switching element switch 3Ln to ON (see FIG. 8). A voltage adjuster ILn is thereby connected to the signal line Vn. The potential of the signal line Ln is thereby drawn by the voltage adjuster ILn, and the line-breakage detection current is extracted.

At the next step 108, the detection circuit 22 sets the switching element switch C3 of the comparison circuit 26 to OFF (see FIG. 8). The voltage of the input Lx of the single-ended inverting amplifier NAMP thereby assumes a high impedance state, and a state is produced in which the charge charged to the capacitors C1, C2 by the initialization operation described above is stored.

At the next step 110, the detection circuit 22 sets the switching element switch C1-A of the comparison circuit 26 to OFF and the switching element switch C2-A to ON. Moreover, the detection circuit 22 sets the switching element switch C1-B to OFF, and sets the switching element switch C2-B to ON. When the charge on the capacitor C1 is denoted charge Q1, the capacitance of the capacitor C1 is denoted capacitance C1, the charge on the capacitor C2 is denoted charge Q2, and the capacitance of the capacitor C2 is denoted capacitance C2, the charges Q1, Q2 can be expressed by Equations (10) and (11) below.

$$Q1 = C1(DVn - Vx) \quad (10)$$

$$Q2 = C2(DV(n-1) - Vx) \quad (11)$$

Moreover, when the voltage of the input signal line Lx is denoted as a voltage Vx', Equation (12) below is given from the combined capacitance of the capacitors C1, C2.

$$(C1+C2)(Lc-Vx) = C1(DVn-Vx) + C2(DV(n-1)-Vx) \quad (12)$$

Equation (13) below is then given accordingly.

$$Vx'-Vx = (Lc - DV(n-1)) - C1/(C1+C2) \times (DVn - DV(n-1)) \quad (13)$$

Since the switching element switch n is in the OFF state, the voltage of the signal line DVn at the drain side of the switching element switch n is equal to the voltage of the signal line Ln.

Since Equation (5) above is given when the output voltage of the single-ended inverting amplifier NAMP is set to Vnampout and the gain is set to Gnamp, when the gain Gnamp is sufficiently high, the logical output of the single-ended inverting amplifier NAMP is determined by the sign of the voltage Vx'−the self-threshold voltage Vx.

When there is no line-breakage in the signal line Vn, the line-breakage detection current (voltage) extracted from the signal line Vn by the voltage adjuster ILn is supplied from the cell C, and the voltage of the signal line Lc therefore remains the voltage of the signal line Vn and does not change. Equation (14) is obtained accordingly.

$$Vx'-Vx = (Lc - DV(n-1)) - C1/(C1+C2) \times (DVn - DV(n-1)) > 0 \quad (14)$$

The output OUT of the comparison circuit 26 thereby becomes L level.

However, when there is a line-breakage in the signal line Vn, a state is given in which the signal line Lc is connected to the voltage adjuster ILn by the switching elements switch 1n, switch 3Ln. When line-breakage detection current is denoted ILn, the voltage of the signal line Lc to which the line-breakage detection current is drawn out is given by Equation (15).

$$Lc = Vn - ILn \quad (15)$$

If the line-breakage detection current is set such that the relationship of Equation (16) below is satisfied, then the output OUT of the comparison circuit 26 becomes H level as in Equation (17) below.

$$ILn > (Lc - DV(n-1)) - C1/(C1+C2) \times (DVn - DV(n-1)) (= \text{the battery voltage of cell } Cn \times C2/(C1+C2)) \quad (16)$$

$$Vx'-Vx = (Lc - DV(n-1)) - C1/(C1+C2) \times (DVn - DV(n-1)) < 0 \quad (17)$$

At the next step 112, the detection circuit 22 detects the output OUT output by the comparison circuit 26. At the next step 114, the detection circuit 22 determines whether the output OUT is H level or L level. When the output OUT is L level, processing proceeds to step 116, and, as described above, processing proceeds to step 122 after it has been determined that there is no line-breakage. However, when the output OUT is H level, processing proceeds to step 118, and, as described above, it is detected that there is a line-breakage, and processing proceeds to step 120 when there is a line-breakage, and then, processing proceeds to step 122 after specific measures have been taken.

At step 122, the detection circuit 22 determines whether or not the operations of step 100 to step 120 have been performed for all of the signal lines V, and if these operations have not been performed for all of the signal lines V, processing returns to step 100 and the present operations are repeated. However, when these operations have been performed for all of the signal lines V, the present processing ends since the line-breakage detection operation has completed for all of the signal lines V.

In the present exemplary embodiment, the results for the output OUT are as listed in Table 2.

TABLE 2

| | Logical value of comparison operation output OUT |
|---|---|
| No line-breakage (OK) | L level |
| Line-breakage present (bad) | H level |

As explained above, in the semiconductor circuit 40 of the present exemplary embodiment, when detecting line-breakages in the signal line Vn at the later stage side of the LPF, the initialization operation produces a state in which the capacitor C1 of the comparison circuit 26 is charged by the difference between the voltage of the signal line DVn and the self-threshold voltage Vx (the signal line DVn−the self-threshold voltage Vx). Moreover, a state is produced in which the capacitor C2 is charged by the difference between the voltage of the signal line DVn−1 and the self-threshold voltage Vx (the signal line DVn−1−the self-threshold voltage Vx). In the comparison operation, the line-breakage detection current is drawn out from the signal line Vn by the voltage adjuster ILn, and the voltage DVn is input to the capacitors C1, C2 by connecting the signal line Lc to the capacitors C1, C2, and it is detected that there is no line-breakage if the output OUT=L level, or it is detected that there is a line-breakage if the output OUT=H level.

Thus, in the semiconductor circuit 40 of the present exemplary embodiment, the switching element switches 1 are provided so as to connect the signal lines Vn to the signal line Lc. The switching element switch 2Ln−1 is provided so as to connect the node between a resistor element Rbal of the discharging circuit 51 and the switching element switch n−1 to the signal line Lil. The switching element switch 2Hn is provided so as to connect the node between the resistor element Rbal of the discharging circuit 51 and the switching element switch n to the signal line Lih. Moreover, the switching element 3Ln is provided so as to connect the signal line Vn to the voltage adjuster ILn.

The semiconductor circuit 40, which is provided with the discharging section 13, and in particular, is provided with the discharging circuit 51, can accordingly appropriately detect line-breakages in the signal lines Vn at the later stage of the discharging section 13 (LPF).

Since the voltage adjusters IL (and IH) are provided at the later stage of the LPF in the present exemplary embodiment, consideration of the effect of the LPF (the resistance Rlpf) is unnecessary when performing line-breakage detection, increasing the accuracy of the line-breakage detection.

Moreover, it goes without saying that the similar advantageous effects to those of the first exemplary embodiment are obtained.

Namely, the voltage adjusters IL are not always connected to the signal lines V, and an advantageous effect is thereby obtained of current not always flowing from the voltage adjusters IL, and current (dark current) not being produced when on standby since the signal lines V are only connected during line-breakage detection.

Since it is sufficient to set the line-breakage detection current such that Equation (16) above is satisfied, the discharging current can be made much smaller when switching element switches short circuit between cells C. Accordingly, variation does not readily arise in the battery voltages of the cells C.

Moreover, since line-breakages can be appropriately detected by the comparison circuit 26, line-breakages can be detected without employing a calculation device or the like for calculating the difference between the voltages measured for the voltage measuring cell selection switch 28 and the voltage measuring circuit 30. An advantageous effect is accordingly obtained of enabling line-breakage detection to be performed even during an operation that measures the battery voltages of the cells C using the voltage measuring cell selection switch 28 and the voltage measuring circuit 30. Namely, the voltage measuring circuit 30 is a single battery monitoring system 10, and the ordinary battery voltages of the cells C can be measured even during line-breakage detection.

Moreover, in the present exemplary embodiment, the voltage adjusters IL are provided in addition to the voltage adjusters IH that supply voltage to the gates of the switching element switches of the discharging circuit 51 so as to control their ON/OFF states, and this makes it unnecessary to provide separate components, and obtains an advantageous effect of, for example, preventing a large increase in the scale of the battery monitoring system 10.

Although explanation has been given in the present exemplary embodiment regarding a case in which the potential of the signal lines Vn is drawn out by the voltage adjusters ILn of the switching element switches 3 in order to detect line-breakages, there is no limitation thereto. For example, line-breakages in the signal lines Vn may be detected by supplying a voltage to the signal lines Vn using the voltage adjusters IHn. In such cases, line-breakage detection can be performed using a line-breakage detection method substantially similar to that described above. More specifically, the switching element switch 2Hn+1 is set to ON by the initialization operation such that the capacitor C1 of the comparison circuit 26 is charged with (DVn+1−Vx), and the switching element switch 2Ln is set to ON such that the capacitor C2 of the comparison circuit 26 is charged with (DVn−Vx). Moreover, in the comparison operation, the switching element switch 1n is set to ON, and in a state in which the signal line Lc is connected to the signal line Vn, the voltage adjuster switch 3Hn is set to ON such that voltage is supplied to the signal line Vn. Thus, it may be detected whether or not a line-breakage is present based on the output result output from the comparison circuit 26. Although using both the voltage adjusters IL and the voltage adjusters IH to detect whether or not a line-breakage is present in the signal lines V enables line-breakage detection to be performed with higher accuracy, configuration may be made such that the other set of the voltage adjusters is not provided in cases in which only one set is employed.

Similarly to in the first exemplary embodiment, the configuration of the discharging circuit 51 of the present exemplary embodiment is also not limited to the above description.

Third Exemplary Embodiment

Explanation follows regarding a semiconductor circuit of a battery monitoring system of a third exemplary embodiment of the present invention, with reference to the drawings. Similarly to the second exemplary embodiment, the present exemplary embodiment detects line-breakages in signal lines V between a discharging section 13 (LPF) and a semiconductor circuit 50 (see the crosses in FIG. 9 to FIG. 12). However, the semiconductor circuit 50 of the present exemplary embodiment differs from the first exemplary embodiment and the second exemplary embodiment in that two comparison circuits 26 (comparison circuits 26A, 26B) are provided.

Figure 9:
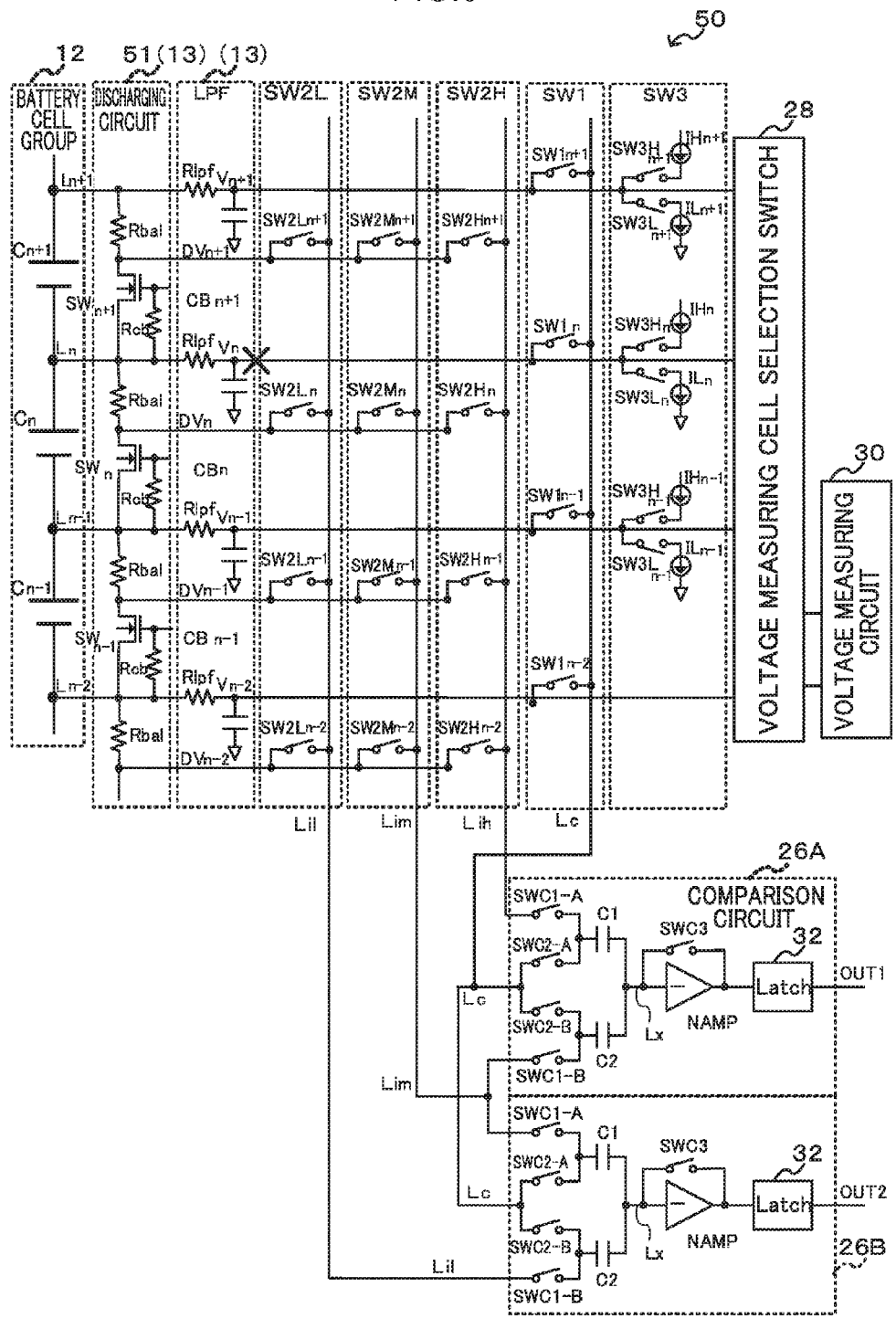
FIG. 9 is a circuit diagram illustrating an example of a schematic configuration of a semiconductor circuit according to a third exemplary embodiment.

FIG. 9 illustrates an example of a schematic configuration of the semiconductor circuit 50 of the present exemplary embodiment. Note that in the present exemplary embodiment, configuration and operation that is substantially similar to that of the first exemplary embodiment or the second exemplary embodiment is stated, and detailed explanation thereof is omitted.

In the semiconductor circuit 50 of the present exemplary embodiment, a respective switching element switch 2M is provided for each respective signal line DV (switching element switches 2M is used to collectively refer to a switch 2Mn-2 to a switch 2LM+1). The switching element switches 2M include functionality to connect the signal line DVn+1 to a signal line Lim based on a control signal from the detection circuit 22. Moreover, the switching element switches 2H include functionality for connecting the signal lines V to a signal line Lih based on the control signal from the detection circuit 22.

Moreover, the semiconductor circuit 50 includes two of the comparison circuits 26 (the comparison circuits 26A, 26B) as described above. Note that in the present exemplary embodiment, the configuration employs a similar chopper-type comparator, as an example.

A capacitor C1 of the comparison circuit 26A is connected to the signal line Lih by the switching element C1-A, and connected to the signal line Lc by the switching element switch C2-A. Moreover, a capacitor C2 is connected to a signal line Lim by a switching element C1-B, and connected to the signal line Lc by a switching element C2-B.

The capacitor C1 of the comparison circuit 26B is connected to the signal line Lim by the switching element C1-A, and connected to the signal line Lc by the switching element C2-A. Moreover, the capacitor C2 is connected to the signal line Lil by the switching element C1-B, and connected to the signal line Lc by the switching element C2-B.

Figure 10:
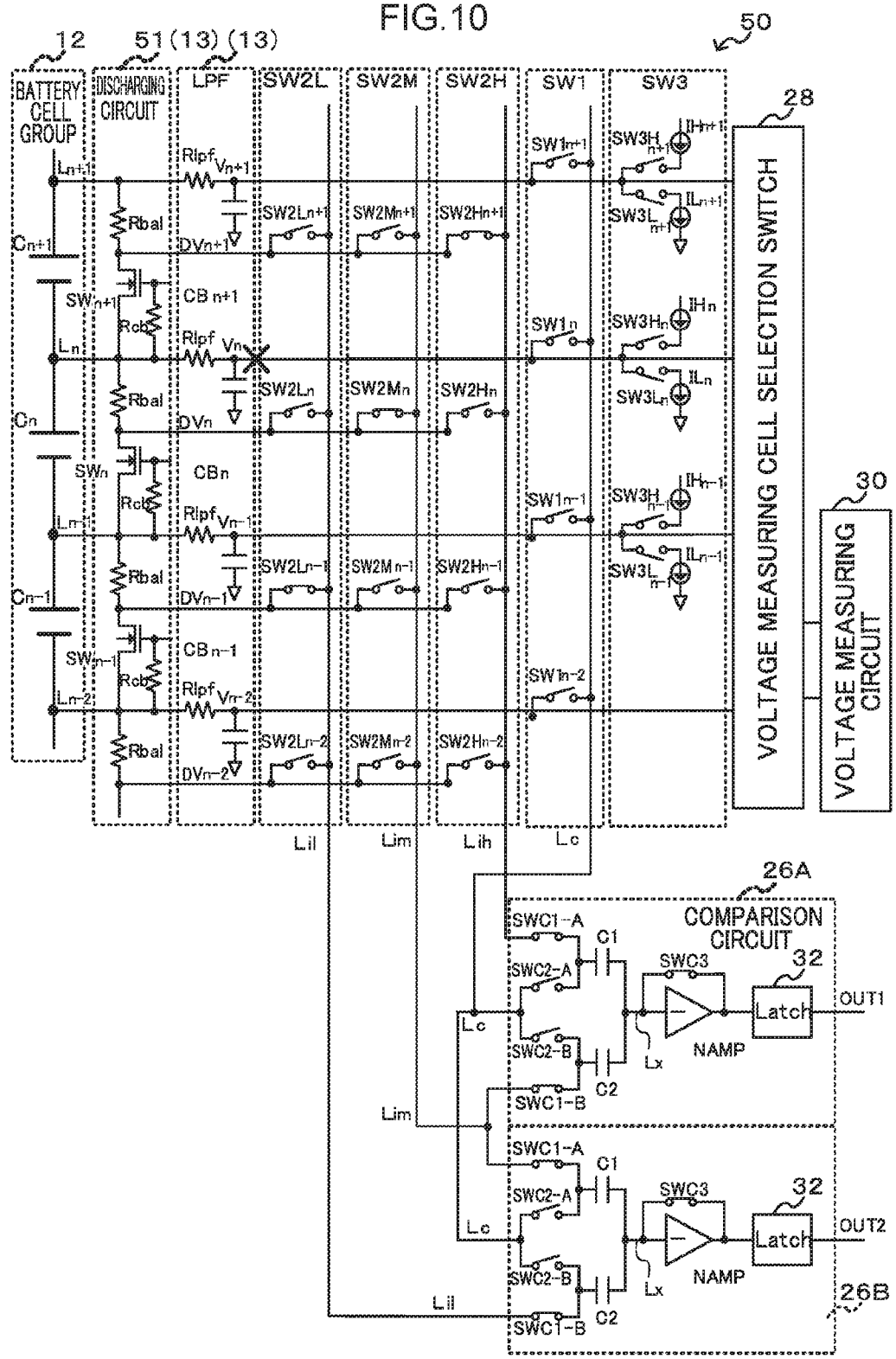
FIG. 10 is a circuit diagram illustrating a state of a semiconductor circuit in an initialization operation according to the third exemplary embodiment.
Figure 11:
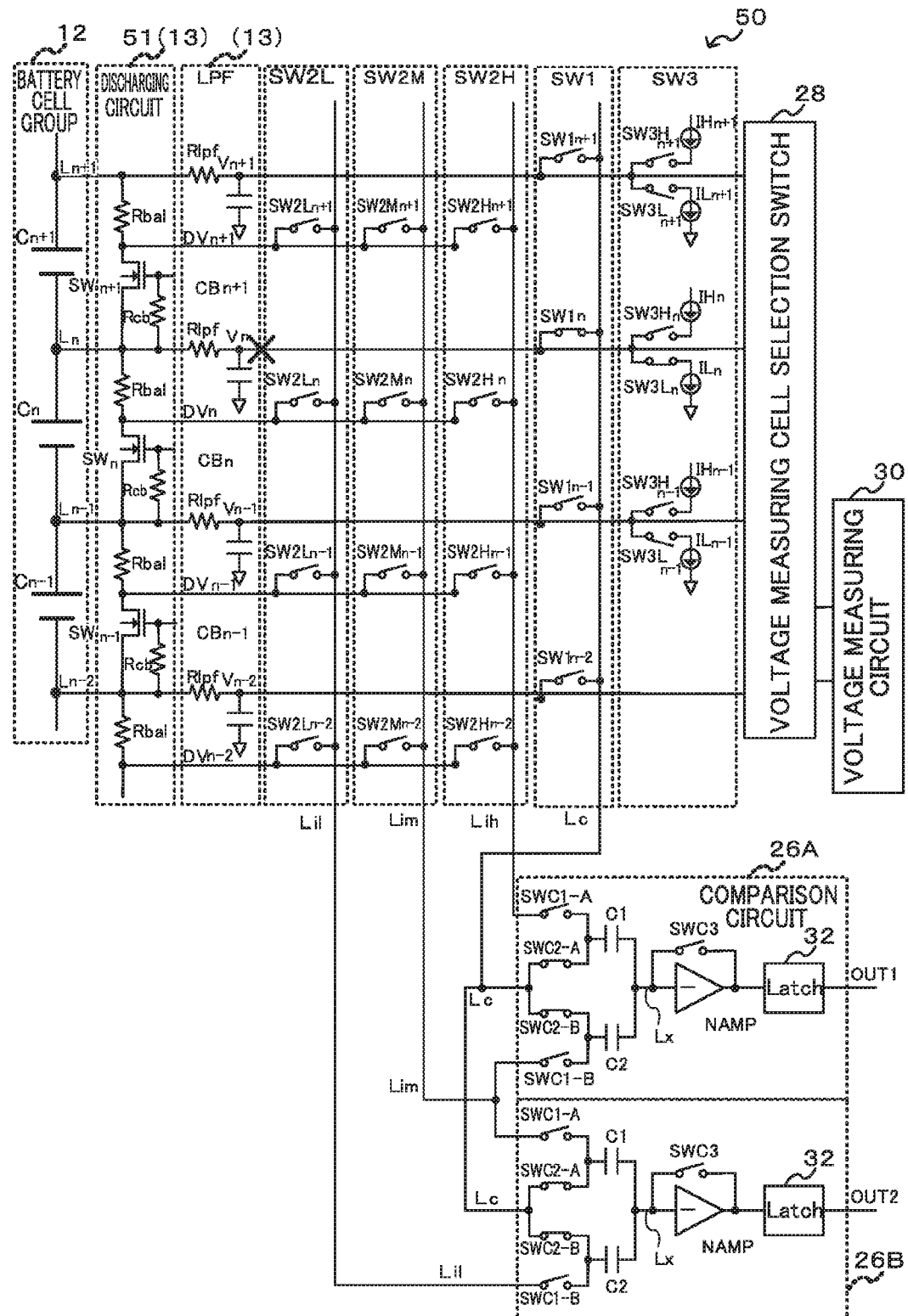
FIG. 11 is a circuit diagram illustrating a state of a semiconductor circuit in a comparison operation 1 according to the third exemplary embodiment.

Next, explanation follows regarding a line-breakage detection operation of the present exemplary embodiment overall. The flow of the line-breakage detection operation is substantially similar to that of the second exemplary embodiment; however, the present exemplary embodiment includes one type of initialization operation and two types of comparison operation (comparison operation 1 and comparison operation 2). The basic operation is substantially similar to that of the first exemplary embodiment and the second exemplary embodiment, and flowcharts thereof are accordingly omitted here. Note that FIG. 10 illustrates a circuit diagram illustrating a state of the semiconductor circuit 50 in the initialization operation. FIG. 11 illustrates a state of the semiconductor circuit 50 in the comparison operation 1. FIG. 12 illustrates a circuit diagram illustrating a state of the semiconductor circuit 50 in the comparison operation 2.

In the initialization operation, a switching element switch 2H of a signal line DV at the high potential side, a switching element 2M of the signal line DV corresponding to the signal line being detected, and a switching element switch 2L of the signal line DVn at the low potential side of the signal line DV corresponding to the signal line being detected, are set to ON. As a specific example, the switching elements switch 2Hn+1, switch 2Mn, and the switch 2Ln-1 are set to ON in the detection circuit 22 (see FIG. 10). Setting the switching element switch 2Hn+1 to ON connects the signal line DVn+1 to the signal line Lih. Moreover, setting the switching element switch 2Mn ON connects the signal line DVn to the signal line Lim. Setting the switching element switch 2Ln-1 to ON connects the signal line DVn-1 to the signal line Lil.

Moreover, set the switching element switches C3 of the comparison circuits 26A, 26B to ON causes the voltage of an input signal line Lx of a single-ended inverting amplifier NAMP of the comparison circuit 26 to become the self-threshold voltage Vx of the single-ended inverting amplifier NAMP.

The detection circuit 22 sets the switching element switch C1-A of the comparison circuit 26A to ON (see FIG. 10). This produces a state in which the capacitor C1 of the comparison circuit 26A has been charged by the difference between the voltage of the signal line DVn+1 and the self-threshold voltage Vx (the voltage of the signal line DVn+1–the self-threshold voltage Vx). The detection circuit 22 also sets the switching element switch C1-B of the comparison circuit 26A to ON by (see FIG. 10). This produces a state in which the capacitor C2 has been charged by the difference between the voltage of the signal line DVn and the self-threshold voltage Vx (the voltage of the signal line DVn–the self-threshold voltage Vx).

The detection circuit 22 sets the switching element switch C1-A of the comparison circuit 26B to ON (see FIG. 10). This produces a state in which the capacitor C1 of the comparison circuit 26B has been charged by the difference between the voltage of the signal line DVn and the self-threshold voltage Vx (the voltage of the signal line DVn–the self-threshold voltage Vx). The detection circuit 22 also sets the switching element switch C1-B of the comparison circuit 26B to ON (see FIG. 10). This produces a state in which the capacitor C2 has been charged by the difference between the voltage of the signal line DVn-1 and the self-threshold voltage Vx (the voltage of the signal line DVn-1–the self-threshold voltage Vx).

When the initialization operation has thus been completed, transition is made to the comparison operation. First, explanation follows regarding the comparison operation 1.

The detection circuit 22 sets the switching elements switch 1 and switch 3L to ON for the signal line V being detected. As a specific example, the detection circuit 22 sets the switching element switch 1n and the switching element switch 3Ln to ON (see FIG. 11). Setting the switching element switch 1n to ON connects the signal line Vn to the signal line Lc. Moreover, setting the switching element switch 3Ln to ON connects the voltage adjuster Ln to the signal line Vn. The potential of the signal line Vn is thereby drawn to the voltage adjuster ILn, and the line-breakage detection current is drawn out.

The detection circuit 22 sets the switching element switch C3 of the comparison circuits 26A, 26B to OFF (see FIG. 11), producing a high impedance state for the voltage of the input Lx of the single-ended inverting amplifier NAMP, and producing a state in which the charge of the capacitors C1, C2 charged by the initialization operation described above is stored.

The detection circuit 22 sets the switching element switch C1-A of the comparison circuit 26A to OFF, and the switching element 2-A to ON. The detection circuit 22 also sets the switching element switch C1-B to OFF, and the switching element 2-B to ON. The signal line Lc is thereby connected to the capacitors C1, C2, and the voltage Vn of the signal line Vn is supplied to the capacitors C1, C2.

Similarly, the detection circuit 22 sets the switching element switch C1-A of the comparison circuit 26B to OFF, and sets the switching element 2-A to ON. The detection circuit 22 also sets the switching element switch C1-B to OFF, and sets the switching element 2-B to ON. The signal line Lc is thereby connected to the capacitors C1, C2, and the voltage Vn of the signal line Vn is supplied to the capacitors C1, C2.

In this state, similarly to the first exemplary embodiment and the second exemplary embodiment, the detection circuit 22 detects the output OUT1 from the comparison circuit 26A, and the output OUT2 from the comparison circuit 26B. When line-breakage does not occur in the signal line Vn, Vx'−Vx<0, and output OUT1=H level in the comparison circuit 26A. Moreover, Vx'−Vx>0, and output OUT2=L level in the comparison circuit 26B.

However, when a line-breakage has occurred, Vx'−Vx<0, and the output OUT1=OUT2=H level in both of the comparison circuits 26A, 26B.

Explanation follows regarding the comparison operation 2.

The detection circuit 22 sets the switching elements switch 1 and switch 3H to ON for the signal line V being detected. As a specific example, the detection circuit 22 sets the switching element switch 1n and the switching element switch 3Hn to ON (see FIG. 12). Setting the switching element switch 1n to ON connects the signal line Vn to the signal line Lc. Setting the switching element switch 3Hn to ON connects the voltage adjuster IHn to the signal line Vn. Potential is thereby supplied to the signal line Vn from the voltage adjuster Ln, and the potential of the signal line Vn is raised.

After the respective capacitors C1, C2 have been charged in the initialization operation, the detection circuit 22 sets the switching element switches C3 of the comparison circuits 26A, 26B to ON (see FIG. 12), producing a high impedance state for the voltage of the input Lx of the single-ended inverting amplifier NAMP, and producing a state in which the charges of the capacitors C1, C2 charged by the initialization operation described above are stored.

The detection circuit 22 sets the switching element switch C1-A of the comparison circuit 26A to OFF, and sets the switching element 2-A to ON. The detection circuit 22 also sets the switching element switch C1-B to OFF, and sets the switching element 2-B to ON. The signal line Lc is thereby connected to the capacitors C1, C2, and the voltage Vn of the signal line Vn is supplied to the capacitors C1, C2.

Similarly, the detection circuit 22 sets the switching element switch C1-A of the comparison circuit 26B to OFF, and sets the switching element 2-A to ON. The detection circuit 22 also sets the switching element switch C1-B to OFF, and the switching element 2-B to ON. The signal line Lc is thereby connected to the capacitors C1, C2, and the voltage Vn of the signal line Vn is supplied to the capacitors C1, C2.

In this state, similarly to the first exemplary embodiment and the second exemplary embodiment, the detection circuit 22 detects the output OUT1 from the comparison circuit 26A, and the output OUT2 from the comparison circuit 26B. Similarly to in the comparison operation 1, when line-breakage does not occur in the signal line Vn, Vx'−Vx<0, and output OUT1=H level in the comparison circuit 26A. Moreover, Vx'−Vx>0, and output OUT2=L level in the comparison circuit 26B.

However, when a line-breakage has occurred, Vx'−Vx>0, and the output OUT1=OUT2=L level in both of the comparison circuits 26A, 26B.

In the present exemplary embodiment, the results of the outputs OUT1, OUT2 are as listed in table 3.

TABLE 3

| | Comparison Operation 1 | | Comparison Operation 2 | |
|---|---|---|---|---|
| | OUT1 | OUT2 | OUT1 | OUT2 |
| No line-breakage (OK) | H level | L level | H level | L level |
| Line-breakage present (bad) | H level | H level | L level | L level |

Thus, in the present exemplary embodiment, although the comparison operation 1 and the comparison operation 2 are performed, the detection circuit 22 detects that there is no line-breakage if the logical outputs (levels) of the outputs OUT1 and OUT2 are H and L and are the logical inverse of each other in the comparison operation 1 and in the comparison operation 2. Moreover, the detection circuit 22 detects that a line-breakage is present in cases in which the logical outputs (levels) of the outputs OUT1 and OUT2 are equal, but are logically inverted from HH to LL between the comparison operation 1 and the comparison operation 2. Moreover, the detection circuit 22 determines that a breakdown occurred in the diagnostic function (the comparison circuits 26A, 26B) in cases in which logical values other than these are indicated for the output OUT1 and the output OUT2. Accordingly, in the semiconductor circuit 50 that includes the discharging section 13, and in particular includes the discharging circuit 51, detection of line-breakages in the signal lines Vn at the later stage of the discharging section 13 (the LPF) can be performed appropriately.

It goes without saying that the present exemplary embodiment also obtains advantageous effects similar to those of the first exemplary embodiment and the second exemplary embodiment described above.

The semiconductor circuit 50 of the present exemplary embodiment also obtains the advantageous effect of enabling line-breakage detection performed in a state in which line-breakage detection current is drawn out by the signal lines Vn, and line-breakage detection performed in a state in which line-breakage detection current is supplied, to be executed redundantly when line-breakage detection using the two comparison circuits 26 is desired.

Note that in the present exemplary embodiment, similarly to in the first exemplary embodiment and the second exemplary embodiment, the configuration of the discharging circuit 51 is not limited to the above description.

In the first exemplary embodiment to the third exemplary embodiment, explanation has been given regarding a case in which line-breakages are detected in signal lines L based on logical values of outputs OUT (H level, L level) in respective comparison operations, and specific measures are executed for line-breakages detected in each the signal lines L. However, there is not limitation thereto. For example, the logical values of the outputs OUT for all of the signal lines L may be obtained and stored in the storage section 23, and the presence or absence of line-breakages may be detected based on the logical values of the outputs OUT of all of the signal lines L stored in the storage section 23, and specific measures executed. As another example, the outputs OUT for the respective comparison operations may be stored in the storage section 23, and after all of the comparison operations have completed, the presence or absence of line-breakages may be detected based on the logical values of all of the outputs OUT stored in the storage section 23, and specific measures executed.

Although the detection circuit 22 and the storage section 23 are provided internally to the semiconductor circuit 14, 40, 50 in the first exemplary embodiment to the third exemplary embodiment described above, there is no limitation thereto, and these may be formed as a separate circuit (on a chip). Moreover, functionality to issue line-breakage detection instruction to the detection circuit 22, and functionality to monitor logical values stored in the storage section 23 and perform diagnosis as to whether or not a line-breakage is present, may be provided internally to the semiconductor circuit 14, 40, 50, or may be formed externally (on a separate chip).

Note that the disclosure of Japanese Patent Application No. 2013-126002 is incorporated in its entirety by reference herein.

All cited documents, patent applications and technical standards mentioned in the present specification are incorporated by reference in the present specification to the same extent as if the individual cited document, patent application, or technical standard was specifically and individually indicated to be incorporated by reference.

The invention claimed is:

1. A battery monitoring system comprising:
    a plurality of batteries connected together in series;
    a discharging unit including a resistor element provided straddling between a first signal line connected to a high potential side in the plurality of respective batteries and a second signal line connected to a low potential side in the plurality of respective batteries, and a discharge switching element connected in series with the resistor element;
    a potential adjusting unit that is connected to the first signal line and supplies a lower potential than the potential of the second signal line in cases in which the discharge switching element is provided between the resistor element and the second signal line, and that is connected to the second signal line and supplies a higher potential than the potential of the first signal line in cases in which the discharge switching element is provided between the resistor element and the first signal line; and
    a comparison unit that compares a first potential between the resistor element and the discharge switching element, against a threshold voltage set from the potential of the first signal line and the potential of the second signal line.

2. The battery monitoring system of claim 1, wherein the comparison unit comprises:
    a single-ended inverting amplifier;
    a first capacitor that is connected to an input of the single-ended inverting amplifier, and to which the first potential or the potential of the first signal line is input; and
    a second capacitor that is connected in parallel to the first capacitor, and to which the first potential or the potential of the second signal line is input.

3. The battery monitoring system of claim 1, wherein:
    the discharge switching element is a transistor to which a gate voltage from a voltage supply unit is applied through a discharge control line; and
    the potential adjusting unit is connected to the first signal line or the second signal line through the discharge control line.

4. The battery monitoring system of claim 1 further comprising a connection unit that includes:
    a first switching element that connects a point between the resistor element and the discharge switching element to a third signal line connected to the first capacitor and the second capacitor;
    a second switching element that connects the first signal line to a fourth signal line connected to the first capacitor; and
    a third switching element that connects the second signal line to a fifth signal line connected to the second capacitor.

5. The battery monitoring system of claim 4, further comprising a high frequency cutoff unit provided between the discharge unit and the connection unit, and wherein the second switching element connects the fourth signal line to the first signal line through the high frequency cutoff unit, and the third switching element connects the fifth signal line to the second signal line through the high frequency cutoff unit.

6. The battery monitoring system of claim 1 further provided with a detection unit that detects line-breakages in the first signal line based on a comparison result of the comparison unit.

7. A battery monitoring system comprising:
    a plurality of batteries connected together in series;
    a discharging unit including a resistor element provided straddling between a first signal line connected to a high potential side in the plurality of respective batteries and a second signal line connected to a low potential side in the plurality of respective batteries, and a discharge switching element connected in series with the resistor element;
    a potential adjusting unit that is connected to the first signal line and supplies a lower potential than the potential of the second signal line in cases in which the discharge switching element is provided between the resistor element and the second signal line, and that is connected to the second signal line and supplies a higher potential than the potential of the first signal line in cases in which the discharge switching element is provided between the resistor element and the first signal line; and
    a comparison unit that compares a later stage section potential of a section at a later stage than the discharge unit on the first signal line provided with the discharge unit, against a threshold voltage set from a first potential between the resistor element and the discharge switching element and set from a third potential between the resistor element of the discharge unit and the discharge switching element provided to a battery connected at a low potential side of the battery.

8. The battery monitoring system of claim 7, wherein the comparison unit comprises:
    a single-ended inverting amplifier;
    a first capacitor that is connected to an input of the single-ended inverting amplifier, and to which the first potential or the later stage section potential is input; and
    a second capacitor that is connected in parallel to the first capacitor, and to which the third potential or the later stage section potential is input.

9. The battery monitoring system of claim 7 further comprising a connection unit that includes:
    a first switching element that connects the first signal line to a third signal line connected to the first capacitor and the second capacitor;
    a second switching element that connects a point between the discharge switching element and the resistor element to a fourth signal line connected to the first capacitor; and
    a third switching element that, through a resistor element of the discharge unit provided to a battery connected to the low potential side of the battery, connects the second signal line to a fifth signal line connected to the second capacitor.

10. The battery monitoring system of claim 9, further comprising a high frequency cutoff unit provided between the discharge unit and the connection unit, and wherein the first switching element connects the third signal line to the first signal line through the high frequency cutoff unit.

11. The battery monitoring system of claim 7 further provided with a detection unit that detects line-breakages in the first signal line based on a comparison result of the comparison unit.

12. A semiconductor circuit comprising:
a potential adjusting unit that is provided to a plurality of respective batteries connected together in series, that is connected to a first signal line and supplies a lower potential than the potential of a second signal line in cases in which a discharge switching element is provided between a resistor element and the second signal line, that is connected to the second signal line and supplies a higher potential than the potential of the first signal line in cases in which the discharge switching element is provided between the resistor element and the first signal line, and that is for the discharge switching element of a discharging unit that includes the resistor element provided straddling between the first signal line connected to a high potential side in the plurality of respective batteries and the second signal line connected to a low potential side in the plurality of respective batteries, and that includes the discharge switching element connected to the resistor element in series; and
a comparison unit that compares a first potential between the resistor element and the discharge switching element, against a threshold voltage set from the potential of the first signal line and the potential of the second signal line.

13. A semiconductor circuit comprising:
a potential adjusting unit that is provided to a plurality of respective batteries connected together in series, that is connected to a first signal line and supplies a lower potential than the potential of a second signal line in cases in which a discharge switching element is provided between a resistor element and the second signal line, that is connected to the second signal line and supplies a higher potential than the potential of the first signal line in cases in which the discharge switching element is provided between the resistor element and the first signal line, and that is for the discharge switching element of a discharging unit that includes the resistor element provided straddling between the first signal line connected to a high potential side in the plurality of respective batteries and the second signal line connected to a low potential side in the plurality of respective batteries, and that includes the discharge switching element connected to the resistor element in series; and
a comparison unit that compares a later stage section potential of a section at a later stage than the discharge unit on the first signal line provided with the discharge unit, against a threshold voltage set from a first potential between the resistor element and the discharge switching element and set from a third potential between the resistor element of the discharge unit and the discharge switching element provided to a battery connected at a low potential side of the battery.

14. A battery monitoring system comprising:
a plurality of batteries connected together in series;
a discharging unit including a resistor element provided straddling between a first signal line connected to a high potential side in the plurality of respective batteries and a second signal line connected to a low potential side in the plurality of respective batteries, and a discharge switching element connected in series with the resistor element;
a first potential adjusting unit that is connected to the first signal line and that is at a lower potential than the potential of the second signal line;
a second potential adjusting unit that is connected to the first signal line and is at a higher potential than the potential of the first signal line;
a first comparison unit that compares a later stage section potential of a section at a later stage than the discharge unit on the first signal line provided with the discharge unit, against a threshold voltage set from a first potential between the resistor element and the discharge switching element and set from a second potential between the resistor element of the discharge unit and the discharge switching element provided to a battery connected at a high potential side of the battery; and
a second comparison unit that compares the later stage section potential against a threshold voltage set from the first potential and set from a third potential between the resistor element of the discharge unit and the discharge switching element provided to a battery connected at a low potential side of the battery.

15. The battery monitoring system of claim 14, wherein:
the first comparison unit includes a first single-ended inverting amplifier, a first capacitor that is connected to an input of the first single-ended inverting amplifier and to which the later stage section potential or the second potential is input, and a second capacitor that is connected in parallel to the first capacitor and to which the later stage section potential or the first potential is input; and
the second comparison unit includes a second single-ended inverting amplifier, a third capacitor that is connected to an input of the second single-ended inverting amplifier and to which the later stage section potential or the first potential is input, and a fourth capacitor that is connected in parallel to the third capacitor and to which the later stage section potential or the third potential is input.

16. The battery monitoring system of claim 14 further comprising a detection unit that detects line-breakages in the first signal line based on the comparison result of the first comparison unit and the comparison result of the second comparison unit.

17. A semiconductor circuit comprising:
a first potential adjusting unit that is provided to each of a plurality of respective batteries connected together in series, that is connected to a first signal line of a discharge unit including a resistor element provided straddling between the first signal line connected to the high potential side in the plurality of respective batteries and a second signal line connected to the low potential side in the plurality of respective batteries and including a discharge switching element connected in series to the resistor element, and that has a lower potential than the potential of the second signal line;
a second potential adjusting unit that is connected to the first signal line, and that has a higher potential than the potential of the first signal line;

a first comparison unit that compares a later stage section potential of a section at a later stage than the discharge unit on the first signal line provided with the discharge unit, against a threshold voltage set from a first potential between the resistor element and the discharge switching element and a second potential between the resistor element of the discharge unit and the discharge switching element provided to a battery connected to the high potential side of the battery; and a second comparison unit that compares the later stage section potential, against a threshold voltage set from the first potential and a third potential between the resistor element of the discharge unit and the discharge switching element provided to a battery connected to the low potential side of the battery.

18. A non-transitory computer-readable storage medium for causing a computer to execute processing that detects line-breakages in the first signal line of the battery monitoring system of claim 2, the line-breakage detection program causing the computer to execute processing comprising:

a step of charging the first capacitor with the difference between the potential of the first signal line and a threshold voltage of the single-ended inverting amplifier;

a step of charging the second capacitor with the difference between the potential of the second signal line and the threshold voltage of the single-ended inverting amplifier;

a step of inputting the first potential to the first capacitor and the second capacitor in a state in which the charges of the first capacitor and the second capacitor are stored;

a step of adjusting the potential of the first signal line using the potential adjusting unit; and a step of outputting a comparison result from the comparison unit.

19. A non-transitory computer-readable storage medium for causing a computer to execute processing that detects line-breakages in the first signal line of the battery monitoring system of claim 8, the line-breakage detection program causing the computer to execute processing comprising:

a step of charging the first capacitor with the difference between the potential of the first signal line and a threshold voltage of the single-ended inverting amplifier;

a step of charging the second capacitor with the difference between the potential of the third signal line and the threshold voltage of the single-ended inverting amplifier;

a step of inputting the later stage section potential to the first capacitor and the second capacitor in a state in which the charges of the first capacitor and the second capacitor are stored;

a step of adjusting the potential of the first signal line using the potential adjusting unit; and a step of outputting a comparison result from the comparison unit.

20. A non-transitory computer-readable storage medium for causing a computer to execute processing that detects line-breakages in the first signal line of the battery monitoring system of claim 15, the line-breakage detection program causing the computer to execute processing comprising:

a step of charging the first capacitor with the difference between the second potential and a threshold voltage of the first single-ended inverting amplifier;

a step of charging the second capacitor with the difference between the first potential and a threshold voltage of the first single-ended inverting amplifier;

a step of charging the third capacitor with the difference between the first potential and a threshold voltage of the second single-ended inverting amplifier;

a step of charging the fourth capacitor with the difference between the third potential and a threshold voltage of the second single-ended inverting amplifier;

a step of inputting the later stage section potential to the first capacitor to the fourth capacitor in a state in which the charges of the first capacitor to the fourth capacitor are stored;

a step of adjusting the potential of the first signal line using the first potential adjusting unit or the second potential adjusting unit; and a step of outputting a comparison result from the first comparison unit and the second comparison unit.

21. A line-breakage detection method for detecting line-breakages in the first signal line of the battery monitoring system of claim 2, the line-breakage detection method comprising:

a process of charging the first capacitor with the difference between the potential of the first signal line and a threshold voltage of the single-ended inverting amplifier;

a process of charging the second capacitor with the difference between the potential of the second signal line and the threshold voltage of the single-ended inverting amplifier;

a process of inputting the first potential to the first capacitor and the second capacitor in a state in which the charges of the first capacitor and the second capacitor are stored;

a process of adjusting the potential of the first signal line using the potential adjusting unit; and a process of outputting a comparison result from the comparison unit.

22. A line-breakage detection method for detecting line-breakages in the first signal line of the battery monitoring system of claim 8, the line-breakage detection method comprising:

a process of charging the first capacitor with the difference between the first potential and a threshold voltage of the single-ended inverting amplifier;

a process of charging the second capacitor with the difference between the third potential and the threshold voltage of the single-ended inverting amplifier;

a process of inputting the later stage potential to the first capacitor and the second capacitor in a state in which the charges of the first capacitor and the second capacitor are stored;

a process of adjusting the potential of the first signal line using the potential adjusting unit; and a process of outputting a comparison result from the comparison unit.

23. A line-breakage detection method for detecting line-breakages in the first signal line of the battery monitoring system of claim 15, the line-breakage detection method comprising:

a method of charging the first capacitor with the difference between the second potential and a threshold voltage of the first single-ended inverting amplifier;

a method of charging the second capacitor with the difference between the first potential and a threshold voltage of the first single-ended inverting amplifier;

a method of charging the third capacitor with the difference between the first potential and a threshold voltage of the second single-ended inverting amplifier;

a method of charging the fourth capacitor with the difference between the third potential and a threshold voltage of the second single-ended inverting amplifier;

a method of inputting the later stage section potential to the first capacitor to the fourth capacitor in a state in which the charges of the first capacitor to the fourth capacitor are stored;

a method of adjusting the potential of the first signal line using the first potential adjusting unit or the second potential adjusting unit; and a method of outputting a comparison result from the first comparison unit and the second comparison unit.

* * * * *